(12) United States Patent
Gondi et al.

(10) Patent No.: US 9,240,784 B2
(45) Date of Patent: Jan. 19, 2016

(54) SINGLE-ENDED CONFIGURABLE MULTI-MODE DRIVER

(71) Applicant: Silicon Image, Inc., Sunnyvale, CA (US)

(72) Inventors: Srikanth Gondi, Sunnyvale, CA (US); Roger Dwain Isaac, San Jose, CA (US); Alan T. Ruberg, Menlo Park, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 14/717,856

(22) Filed: May 20, 2015

(65) Prior Publication Data

US 2015/0256176 A1  Sep. 10, 2015

Related U.S. Application Data

(63) Continuation of application No. 13/174,630, filed on Jun. 30, 2011, now Pat. No. 9,071,243.

(51) Int. Cl.
| | |
|---|---|
| *H03K 19/094* | (2006.01) |
| *H03K 19/00* | (2006.01) |
| *H03K 19/0185* | (2006.01) |
| *H04L 25/02* | (2006.01) |
| *H03K 3/012* | (2006.01) |
| *H04L 12/12* | (2006.01) |

(52) U.S. Cl.
CPC ............ *H03K 19/0005* (2013.01); *H03K 3/012* (2013.01); *H03K 19/018557* (2013.01); *H03K 19/018571* (2013.01); *H04L 12/12* (2013.01); *H04L 25/028* (2013.01); *H04L 25/0278* (2013.01)

(58) Field of Classification Search
CPC .......... H03K 19/0005; H04L 25/0278; H04L 25/0298
USPC ............ 326/30, 82–83, 86–87; 327/108–109, 327/112
See application file for complete search history.

(56) References Cited

U.S. PATENT DOCUMENTS

| | | | |
|---|---|---|---|
| 5,982,210 | A | 11/1999 | Rogers |
| 6,130,563 | A | 10/2000 | Pilling et al. |

(Continued)

FOREIGN PATENT DOCUMENTS

| | | |
|---|---|---|
| CN | 1105974 C | 4/2003 |
| CN | 1538703 A | 10/2004 |

(Continued)

OTHER PUBLICATIONS

High-Definition Multimedia Interface Specification Version 1.3, HDMI Licensing LLC, Jun. 22, 2006, 237 pages.

(Continued)

*Primary Examiner* — Jason M Crawford
(74) *Attorney, Agent, or Firm* — Fenwick & West LLP

(57) ABSTRACT

Embodiments of the invention are generally directed to a single-ended configurable multi-mode driver. An embodiment of an apparatus includes an input to receive an input signal, an output to transmit a driven signal generated from the input signal on a communication channel, a mechanism for independently configuring a termination resistance of the driver apparatus, and a mechanism for independently configuring a voltage swing of the driven signal without modifying a supply voltage for the apparatus.

19 Claims, 21 Drawing Sheets

(56) References Cited

U.S. PATENT DOCUMENTS

| | | |
|---|---|---|
| 6,288,563 B1 | 9/2001 | Muljono et al. |
| 6,397,042 B1 | 5/2002 | Prentice et al. |
| 6,560,290 B2 | 5/2003 | Ahn et al. |
| 6,677,793 B1 | 1/2004 | Chan et al. |
| 6,714,465 B2 | 3/2004 | Jang |
| 6,718,473 B1 | 4/2004 | Mirov et al. |
| 6,748,469 B1 | 6/2004 | Caldwell et al. |
| 6,845,420 B2 | 1/2005 | Resnick |
| 6,859,107 B1 | 2/2005 | Moon et al. |
| 6,862,246 B2 | 3/2005 | Funaba et al. |
| 6,870,419 B1 * | 3/2005 | Garrett et al. ............... 327/535 |
| 6,876,240 B2 | 4/2005 | Moon et al. |
| 6,888,417 B2 | 5/2005 | Moon et al. |
| 6,901,126 B1 | 5/2005 | Gu |
| 6,996,749 B1 | 2/2006 | Bains et al. |
| 7,032,058 B2 | 4/2006 | Horowitz et al. |
| 7,036,032 B2 | 4/2006 | Mizuyabu et al. |
| 7,089,444 B1 | 8/2006 | Asaduzzaman et al. |
| 7,102,446 B1 | 9/2006 | Lee et al. |
| 7,133,648 B1 | 11/2006 | Robinson et al. |
| 7,155,617 B2 | 12/2006 | Gary et al. |
| 7,191,371 B2 | 3/2007 | Hsu et al. |
| 7,203,260 B2 | 4/2007 | Moon et al. |
| 7,209,178 B1 | 4/2007 | Lee et al. |
| 7,254,797 B2 | 8/2007 | Garlepp |
| 7,308,058 B2 | 12/2007 | Zerbe et al. |
| 7,345,602 B2 | 3/2008 | Saeki et al. |
| 7,389,097 B2 | 6/2008 | Tamura |
| 7,389,190 B2 | 6/2008 | Umemura et al. |
| 7,406,118 B2 | 7/2008 | Groen et al. |
| 7,447,278 B2 | 11/2008 | Menolfi et al. |
| 7,450,535 B2 | 11/2008 | Best |
| 7,453,833 B2 | 11/2008 | Yi et al. |
| 7,475,273 B2 | 1/2009 | Gredone et al. |
| 7,493,095 B2 | 2/2009 | Chuang et al. |
| 7,496,774 B2 | 2/2009 | Lu |
| 7,501,851 B2 | 3/2009 | Venditti et al. |
| 7,505,512 B1 | 3/2009 | Anderson et al. |
| 7,555,048 B1 | 6/2009 | Massoumi et al. |
| 7,583,753 B2 | 9/2009 | Okamura |
| 7,617,064 B2 | 11/2009 | Stakely et al. |
| 7,697,649 B2 | 4/2010 | Okamura |
| 7,840,727 B2 | 11/2010 | Saeki et al. |
| 7,898,288 B2 | 3/2011 | Wong |
| 7,916,560 B2 | 3/2011 | Kim |
| 7,945,805 B2 | 5/2011 | Baumgartner et al. |
| 8,050,317 B2 | 11/2011 | Okamura et al. |
| 8,051,228 B2 | 11/2011 | Arimilli et al. |
| 8,135,100 B2 | 3/2012 | Beukema et al. |
| 8,208,815 B1 | 6/2012 | Chiang et al. |
| RE43,539 E | 7/2012 | Takahashi |
| 8,275,030 B2 | 9/2012 | Werner et al. |
| 8,279,976 B2 | 10/2012 | Lin et al. |
| 8,290,028 B2 | 10/2012 | Takeuchi |
| 8,415,980 B2 | 4/2013 | Fiedler |
| 8,416,001 B2 | 4/2013 | Ding et al. |
| 8,520,348 B2 | 8/2013 | Dong |
| 8,520,765 B2 | 8/2013 | Fukuda |
| 8,578,222 B2 | 11/2013 | Chun et al. |
| 8,593,885 B2 | 11/2013 | Ware |
| 8,624,641 B1 | 1/2014 | Faucher et al. |
| 8,650,429 B1 | 2/2014 | Starr et al. |
| 8,705,605 B1 | 4/2014 | Raman et al. |
| 8,760,977 B2 | 6/2014 | Wilson |
| 8,779,819 B1 | 7/2014 | Venditti |
| 8,832,487 B2 | 9/2014 | Fiedler |
| 8,861,667 B1 | 10/2014 | Zerbe et al. |
| 8,878,792 B2 | 11/2014 | Lim et al. |
| 8,879,618 B2 | 11/2014 | Abdalla et al. |
| 8,886,840 B2 | 11/2014 | Fujimori et al. |
| 8,913,895 B1 | 12/2014 | Chiang et al. |
| 8,930,647 B1 | 1/2015 | Smith |
| 2002/0061016 A1 | 5/2002 | Mullaney et al. |
| 2002/0144043 A1 | 10/2002 | Bennett et al. |
| 2003/0074515 A1 | 4/2003 | Resnick |
| 2003/0105896 A1 | 6/2003 | Gredone et al. |
| 2003/0218477 A1 | 11/2003 | Jang et al. |
| 2004/0098545 A1 | 5/2004 | Pline et al. |
| 2005/0007145 A1 | 1/2005 | Dreps et al. |
| 2005/0030200 A1 | 2/2005 | Holt |
| 2005/0052200 A1 | 3/2005 | Nguyen et al. |
| 2005/0174153 A1 | 8/2005 | Saeki |
| 2005/0242851 A1 | 11/2005 | Booth et al. |
| 2006/0017470 A1 | 1/2006 | Park et al. |
| 2006/0034394 A1 | 2/2006 | Popescu et al. |
| 2006/0188043 A1 | 8/2006 | Zerbe et al. |
| 2006/0192622 A1 | 8/2006 | Narita |
| 2007/0035336 A1 | 2/2007 | Lee |
| 2007/0080718 A1 | 4/2007 | Stojanovic et al. |
| 2007/0127614 A1 | 6/2007 | Kawakami |
| 2007/0230513 A1 | 10/2007 | Talbot et al. |
| 2007/0252624 A1 | 11/2007 | Sohn |
| 2007/0281741 A1 | 12/2007 | Lu et al. |
| 2008/0122488 A1 | 5/2008 | Chen |
| 2008/0123792 A1 | 5/2008 | Prete et al. |
| 2008/0164905 A1 | 7/2008 | Hamanaka |
| 2008/0284466 A1 | 11/2008 | Cranford, Jr. et al. |
| 2008/0310491 A1 | 12/2008 | Abbasfar et al. |
| 2009/0059712 A1 | 3/2009 | Lee et al. |
| 2009/0125260 A1 | 5/2009 | Bosnecker |
| 2009/0153219 A1 | 6/2009 | Wu et al. |
| 2009/0182912 A1 | 7/2009 | Yoo et al. |
| 2009/0256585 A1 * | 10/2009 | Kwon et al. ............... 326/30 |
| 2009/0289668 A1 * | 11/2009 | Baldisserotto et al. ....... 327/108 |
| 2009/0327565 A1 | 12/2009 | Ware |
| 2010/0060316 A1 | 3/2010 | Kim et al. |
| 2010/0097094 A1 * | 4/2010 | Jang ............................. 326/30 |
| 2010/0103994 A1 | 4/2010 | Frans et al. |
| 2010/0127751 A1 | 5/2010 | Lin |
| 2010/0157644 A1 | 6/2010 | Norman |
| 2010/0164539 A1 | 7/2010 | Balamurugan et al. |
| 2010/0296566 A1 | 11/2010 | Beyene et al. |
| 2011/0050280 A1 * | 3/2011 | Maddux et al. ............... 326/30 |
| 2011/0099410 A1 | 4/2011 | Yin et al. |
| 2011/0193591 A1 | 8/2011 | Nguyen et al. |
| 2011/0196997 A1 | 8/2011 | Ruberg et al. |
| 2011/0222594 A1 | 9/2011 | Zerbe et al. |
| 2011/0235763 A1 | 9/2011 | Palmer et al. |
| 2011/0260756 A1 | 10/2011 | Agut |
| 2012/0072759 A1 | 3/2012 | Wu et al. |
| 2013/0002301 A1 | 1/2013 | Gondi et al. |
| 2013/0038346 A1 | 2/2013 | Hollis |
| 2013/0093433 A1 | 4/2013 | Lee et al. |
| 2013/0148448 A1 | 6/2013 | Matsui |
| 2014/0107997 A1 | 4/2014 | Li et al. |
| 2014/0149775 A1 | 5/2014 | Ware |
| 2014/0211862 A1 | 7/2014 | Moghe et al. |
| 2014/0372785 A1 | 12/2014 | Fiedler |

FOREIGN PATENT DOCUMENTS

| | | |
|---|---|---|
| CN | 1959801 A | 5/2007 |
| CN | 101904100 A | 12/2010 |
| CN | 102075462 A | 5/2011 |
| EP | 0834814 | 4/1998 |
| JP | 2008-92285 A | 4/2008 |
| JP | 2009-225406 A | 1/2009 |
| TW | 200803407 A | 1/2008 |
| WO | WO 2009/125260 A1 | 10/2009 |

OTHER PUBLICATIONS

Low Power Double Data Rate 2 (LPDDR2) Standard, JEDEC Solid State Technology Association, Apr. 2011, 284 pages.

Non-Final Office Action for U.S. Appl. No. 11/690,659 mailed Feb. 23, 2010.

Notice of Allowance for U.S. Appl. No. 11/690,659 mailed Aug. 25, 2010.

International Search Report and Written Opinion for International Patent Application No. PCT/US2011/023697, Mailed Oct. 25, 2011, 11 pages.

Final Office Action for U.S. Appl. No. 12/704,417, Mailed Feb. 14, 2012, 18 pages.

(56) References Cited

OTHER PUBLICATIONS

Ross, Kevin, The Basics—Very Basic Circuits, Mar. 1997, www.seattlerobotics.org.
Leibowitz, B., et al., "A 4.3GB/s Mobile Memory Interface With Power-Efficient Bandwidth Scaling," IEEE J. Solid-State Circuits, Apr. 2010.
Partovi, H., et al., "Single-ended Transceiver Design Techniques for 5.33Gb/s Graphics Applications," IEEE International Solid-State Circuits Conference, Feb. 2009.
International Search Report and Written Opinion of the International Searching Authority in International Patent Application No. PCT/US2012/043767, 15 pages.
International Search Report and Written Opinion of the International Searching Authority in International Patent Application No. PCT/US2012/043770, 9 pages.
Wong, K-L J., et al., "A 27mW 3.6-Gb/s I/O Transceiver," IEEE J. Solid-State Circuits, Apr. 2004.
Office Action mailed Aug. 31, 2011, in U.S. Appl. No. 12/704,417, 12 pages.
Office Action mailed Jan. 15, 2013, in U.S. Appl. No. 13/174,616, 15 pages.
Bae, Seung-Jun, et al., "An 80nm 4Gb/s/pin 32 bit 512Mb GDDR4 Graphics DRAM with Low Power and Low Noise Data Bus Inversion," IEEE J. Solid-State Circuits, Jan. 2008.
Dettloff, W. D., et al., "A 32mW 7.4Gb/s Protocol-Agile Source-Series Terminated Transmitter in 45nm CMOS SOI," IEEE International Solid-State Circuits Conference, Feb. 2010.
International Preliminary Report on Patentability for International Patent Application No. PCT/US2008/057926 mailed Oct. 8, 2009.
Razavi, B., "Prospects of CMOS Technology for High-Speed Optical Communication Circuits," IEEE J. Solid-State Circuits, Sep. 2002.
Balamurugan, G. et al., "Modeling and Analysis of High-Speed I/O Links," IEEE Transactions on Advanced Packaging, May 2009.
Lee, H. et al., "A 16 Gb/s/Link, 64 GB/s Bidirectional Asymmetric Memory Interface," IEEE J. Solid-State Circuits, Apr. 2009.
International Search Report and Written Opinion of the International Searching Authority dated Nov. 25, 2013, in International Patent Application No. PCT/US2013/052126, 13 pages.
Palermo, S. et al., "A 90 nm CMOS 16 Gb/s Transceiver for Optical Interconnects," IEEE J. Solid-State Circuits, May 2008.
Taiwan Office Action, Taiwan Application No. 100104342, Apr. 23, 2014, 12 pages (with concise explanation of relevance).
Chinese First Office Action, Chinese Application No. 201180007515.9, Jul. 16, 2014, 23 pages.
Office Action mailed Aug. 2, 2013, in U.S. Appl. No. 13/934,147, 6 pages.
European Extended Search Report, European Application No. 12804105.0, Nov. 24, 2014, 9 pages.
Drost, R.J. et al., "An 8-Gb/s/pin Simultaneously Bidirectional Transceiver in 0.35-.mu.m CMOS," IEEE Journal of Solid-State Circuits, IEEE, Nov. 2004, pp. 1894-1908, vol. 39, No. 11.
Kossel, M. et al., "A T-Coil-Enhanced 8.5 Gb/s High-Swing SST Transmitter in 65 nm Bulk CMOS with < −16 dB Return Loss Over 10 GHz Bandwidth," IEEE Journal of Solid-State Circuits, IEEE, Dec. 2008, pp. 2905-2920, vol. 43, No. 12.
Partovi, H. et al., "Single-Ended Transceiver Design Techniques for 5.66Gb/s Graphics Applications," International Solid-State Circuits Conference (ISSCC), San Francisco, CA, IEEE, Feb. 2009, pp. 136-137.
PCT International Search Report and Written Opinion, PCT Application No. PCT/US2014/016091, May 26, 2014, 10 pages.
European Extended Search Report, European Application No. 12803660.5, Oct. 7, 2014, 11 pages.
Chinese First Office Action, Chinese Application No. 201280025948.1, Jan. 4, 2015, 14 pages.
Japanese Office Action, Japanese Application No. 2012-552909, Feb. 10, 2015, 4 pages (with English summary).
United States Office Action, U.S. Appl. No. 13/174,630, Nov. 6, 2013, 13 pages.
United States Office Action, U.S. Appl. No. 13/174,630, Jan. 15, 2013, 12 pages.
European Extended Search Report, European Application No. 11742641.1, Jun. 15, 2015, 5 pages.
Chinese Second Office Action, Chinese Application No. 201180007515.9, Mar. 9, 2015, 11 pages.
Chinese Second Office Action, Chinese Application No. 201280025948.1, Sep. 22, 2015, 14 pages.

* cited by examiner

SINGLE-ENDED CONFIGURABLE MULTI-MODE DRIVER

CROSS REFERENCE TO RELATED APPLICATIONS

This application is a continuation of U.S. patent application Ser. No. 13/174,630, filed on Jun. 30, 2011, which is incorporated by reference in its entirety.

TECHNICAL FIELD

Embodiments of the invention generally relate to the field of electronic devices and, more particularly, to a single-ended configurable multi-mode driver.

BACKGROUND

In the communication of signals between devices or elements, a driver circuit or apparatus is used to drive the signal. For example, a driver may be required for driving signal in a high-speed memory interface and similar processes.

Numerous different conventional circuit technologies may be used for driver circuits. The technologies may in complexity and structure, including voltage-mode drivers with or without termination resistances, differential drivers, and current-mode drivers.

However, such conventional driver technologies have significant limitations. Such circuits often generate significant power dissipation, or require doubled speed if a differential structure is chosen. Further, conventional circuit structures are generally limited in their reactions to differing environments, and thus may provide impedances and voltage swings that pose difficulties for certain usages.

BRIEF DESCRIPTION OF THE DRAWINGS

Embodiments of the invention are illustrated by way of example, and not by way of limitation, in the figures of the accompanying drawings in which like reference numerals refer to similar elements.

SUMMARY

Figure 1:
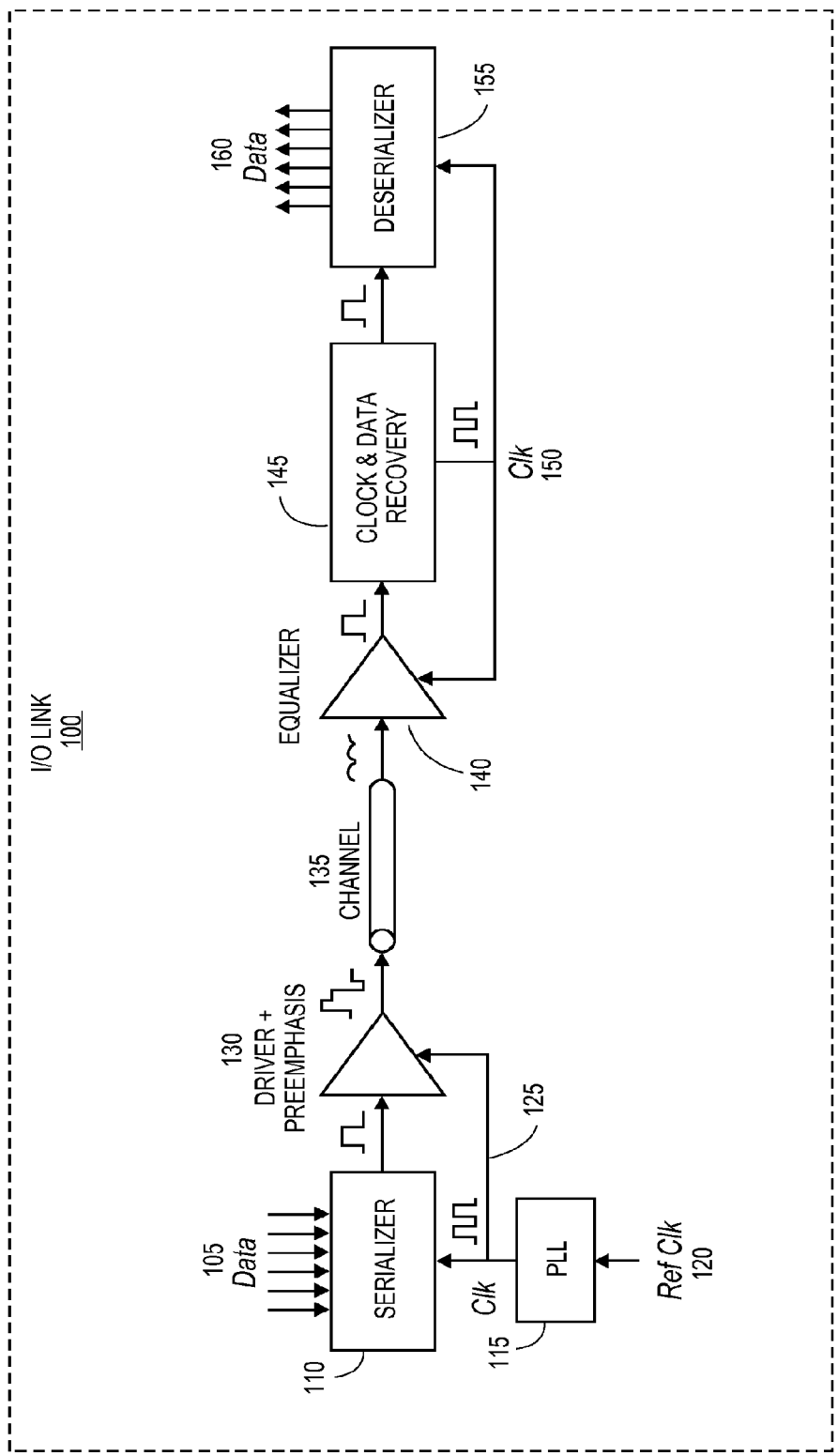
FIG. 1 illustrates an embodiment of elements of an I/O link.

Embodiments of the invention are generally directed to a single-ended configurable multi-mode driver.

In a first aspect of the invention, an embodiment of a single-ended driver apparatus includes an input to receive an input signal, an output to transmit a driven signal generated from the input signal on a communication channel, a mechanism for independently configuring a termination resistance of the driver apparatus, and a mechanism for independently configuring a voltage swing of the driven signal without modifying a supply voltage for the apparatus.

In a second aspect of the invention, a system includes a communication channel; a single-ended driver apparatus coupled with the communication channel to provide a driven signal, the transmitting apparatus including an mechanism for independently configuring a termination resistance of the driver apparatus, and an mechanism for independently configuring a voltage swing of the driven signal without modifying a supply voltage for the driver apparatus; and a receiving apparatus coupled with the communication channel to receive the driven signal.

In a third aspect of the invention, an embodiment of a system for signal communication includes a first device including a first single-ended driver apparatus and first receiver apparatus and a second device coupled with the first device via a communication channel including a second single-ended driver apparatus and a second receiver apparatus. Termination resistances and voltage swings of the first driver apparatus and second driver apparatus are independently configurable, and the voltage swing and the termination resistance of the first driver apparatus of the first device may be configured to be different from the voltage swing and termination resistance of the second driver apparatus.

In a fourth aspect of the invention, a method for configuring a communication interface includes determining parameters for an interface between a first device and a second device, the first device including a configurable driver apparatus and the second device including a receiving apparatus; independently configuring a termination resistance of the driver apparatus of the first device based on the determined parameters; and independently configuring a voltage swing of the driver apparatus of the first device based on the determined parameters without modifying a supply voltage for the first device.

DETAILED DESCRIPTION

Embodiments of the invention are generally directed to a single-ended configurable multi-mode driver.

In some embodiments, a method, apparatus, or system provides for a single-ended configurable multi-mode driver. In some embodiments, an apparatus or system provides a driver to provide signaling, such as a driver for high-speed wire-line interfaces, including, for example, DRAM (dynamic random access memory) interfaces. In some embodiments, a driver may be configurable for voltage swing characteristics and termination resistances. In some embodiments, a driver is a multi-mode mode, where "multi-mode" refers to operation at multiple different speeds.

There are numerous circuit technologies for drivers that may be utilized. However, existing driver structures commonly exhibit one or more of the following issues:
 (1) Excessive power dissipation;
 (2) Differential structures that require doubling the speed of operation;
 (3) Not configurable for termination resistance;
 (4) Not configurable for voltage swings;
 (5) Close relation between supply voltage and voltage swings;
 (6) Requirement for a voltage regulator having large decoupling caps;
 (7) Limited data rates.

In some embodiments, an apparatus includes an input to receive an input signal, an output to transmit a driven signal generated from the input signal on a communication channel, a mechanism for configuring a termination resistance of the driver apparatus, and a mechanism for configuring a voltage swing of the driven signal.

In some embodiments, a system includes a communication channel, a driver apparatus coupled with the communication channel to provide a driven signal, the transmitting apparatus including a mechanism for configuring a termination resistance of the driver apparatus and a mechanism for configuring a voltage swing of the driven signal, and a receiving apparatus coupled with the communication channel to receive the driven signal.

FIG. 1 illustrates an embodiment of elements of an I/O link. In this illustration, functional blocks of a single-channel I/O link electrically connecting two devices are provided. As shown, parallel data 105 is serialized by a serializer 110, with the serialized output being received by a driver 130 for transmission via a channel 135. The serializer 110 and driver 130 may be clocked by a clock signal 125 produced by a phase lock loop (PLL) circuit 115, which creates the clock signal 125 using a reference clock signal 120. The serialized data transmitted via the channel 135 is received by a signal equalizer 140, which provides equalized data signals to a clock and data recovery element 145. The clock and data recovery element provides recovered data to a deserializer 155 and a recovered clock signal 150 to the equalizer 140 and deserializer 155. The deserializer 155 deserializes the data and produces a parallel data output 160.

In operation, a significant portion of the overall power consumption of the I/O link 100 is dissipated by the driver 130. In some embodiments, the driver 130 is a configurable multi-mode driver that may be configured to control power consumption.

Figure 2:
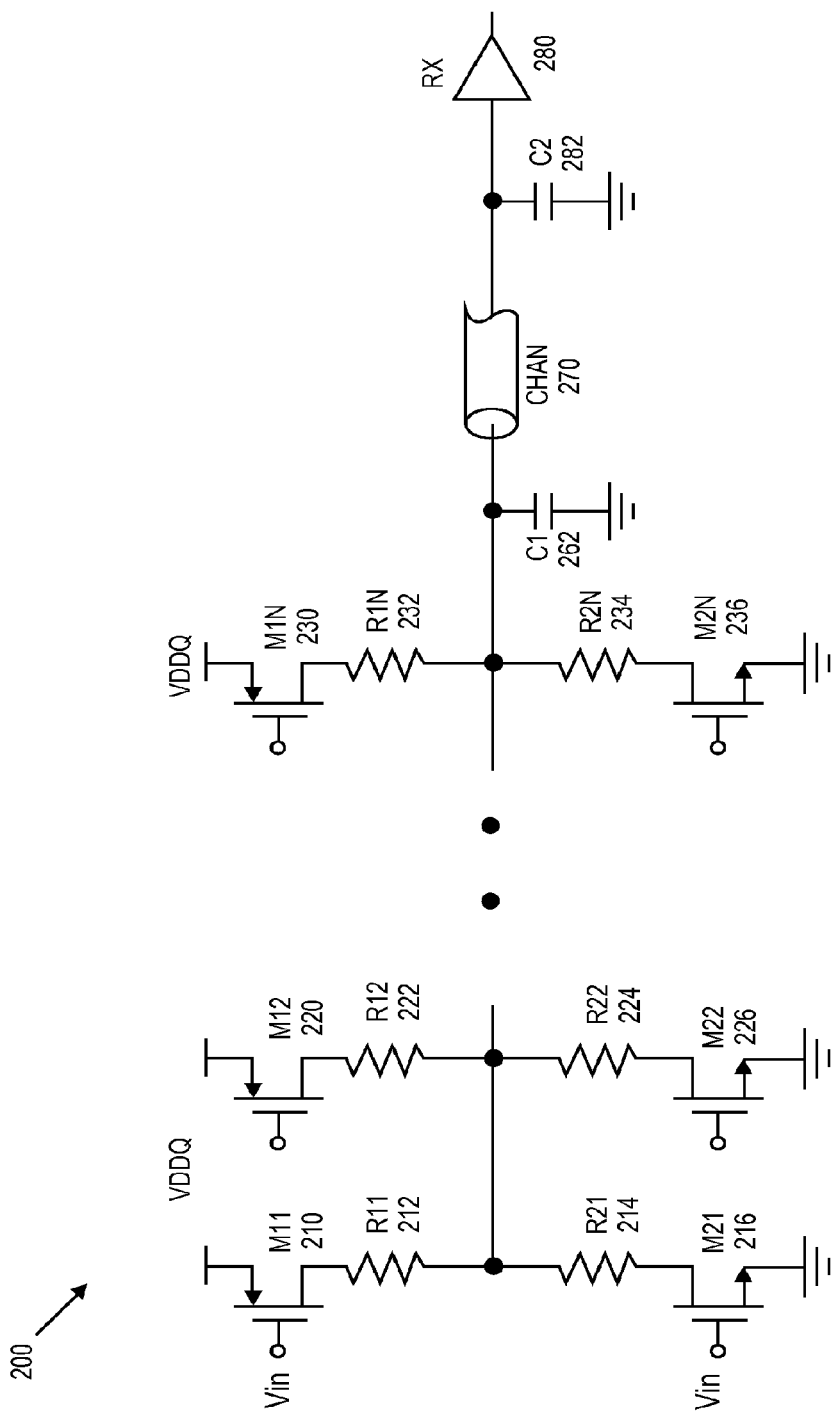
FIG. 2 illustrates a single-ended voltage-mode driver.

FIG. 2 illustrates a single-ended voltage-mode driver. In this illustration, a single ended (as opposed to differential) driver 200 may, for example, provide transmission for speeds up to 1 Gbps (gigabit per second). In this illustration, the driver 200 operates to drive signals via a channel (CHAN) 270 to a receiver (RX) 250, the channel connection of the driver 200 being coupled with ground by a first capacitor (C1) 262 and the channel connection of the receiver 280 being coupled with ground by a second capacitor (C2) 282. The driver 200 includes transistors M11 210, M21 216, M12 220, M22 226 . . . . MlN 230, M2N 236, which are used as switches, with variation in termination being provided with the switchable combination of resistors 811212 through R2N 234 as controlled by the transistors.

An advantage of driver 200 over certain technologies is that the driver generally consumes only dynamic power. However, at higher data rates (such as rates>2 Gbps) signal integrity performance may deteriorate rapidly due to signal reflections and supply bounce, which thus limits speeds and BER (bit error rate). Therefore, at higher speeds two techniques are commonly used to combat signal reflections and supply bounce. For mitigating reflections, a termination resistor may be used on both the receiver and transmitter ends. To mitigate supply bounce effects, differential circuit structures are used. However, both of these structures or methods have significant power penalties, which are described in more detail below.

Figure 3:
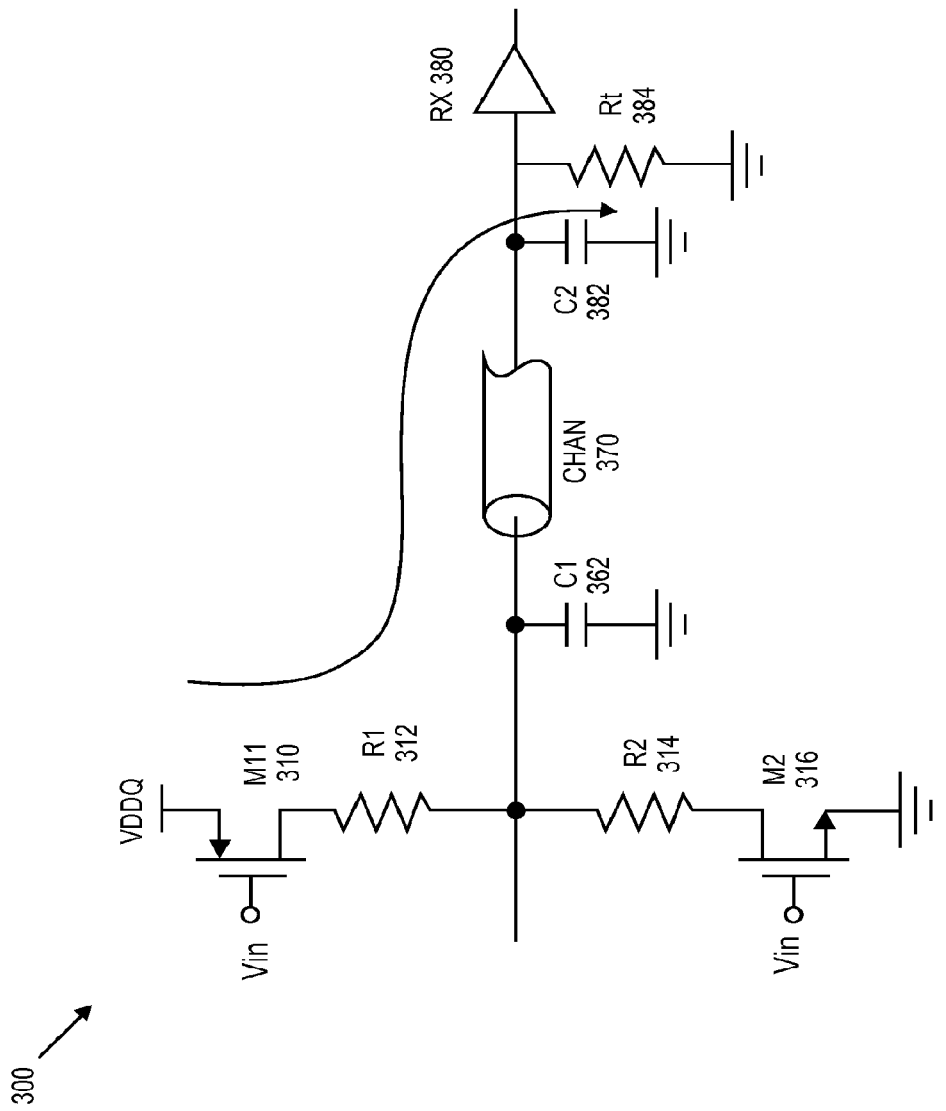
FIG. 3 illustrates a single-ended voltage-mode driver with termination provided on transmitting and receiving sides.

FIG. 3 illustrates a single-ended voltage-mode driver with termination resistance provided on transmitting and receiving sides. In this illustration, a driver 300 is coupled with a receiver (RX) 380 via a channel (CHAN) 370, with the channel connection to driver 300 being coupled with ground by a first capacitor (C1) 362 and the channel connection of the receiver 380 being coupled with ground by a second capacitor (C2) 382. Driver 300 includes a first transistor (M1) 310 operating as a switch between a voltage VDDQ and a first end of a first resistor (R1) 312, where a second end of R2 314 is coupled with CHAN 370. Driver 300 further includes a second transistor (M2) 316 operating as a switch between ground and a first end of a second resistor (R2) 314, wherein a second end of R2 314 is coupled with a second end of R1 312 and CHAN 370.

In operation, in addition to the dynamic current usage of driver 300, driver 300 also draws a static current generally equal to VDDQ/2R (where R is the resistance of R1 and Rt) in a high state. For example, if VDDQ=1.2 V and 2R=100 ohms, the static current is approximately 12 mA, which is prohibitively high for mobile applications where there may be many such channels in an apparatus. In the low state, the driver would draw essentially no current.

Figure 4:
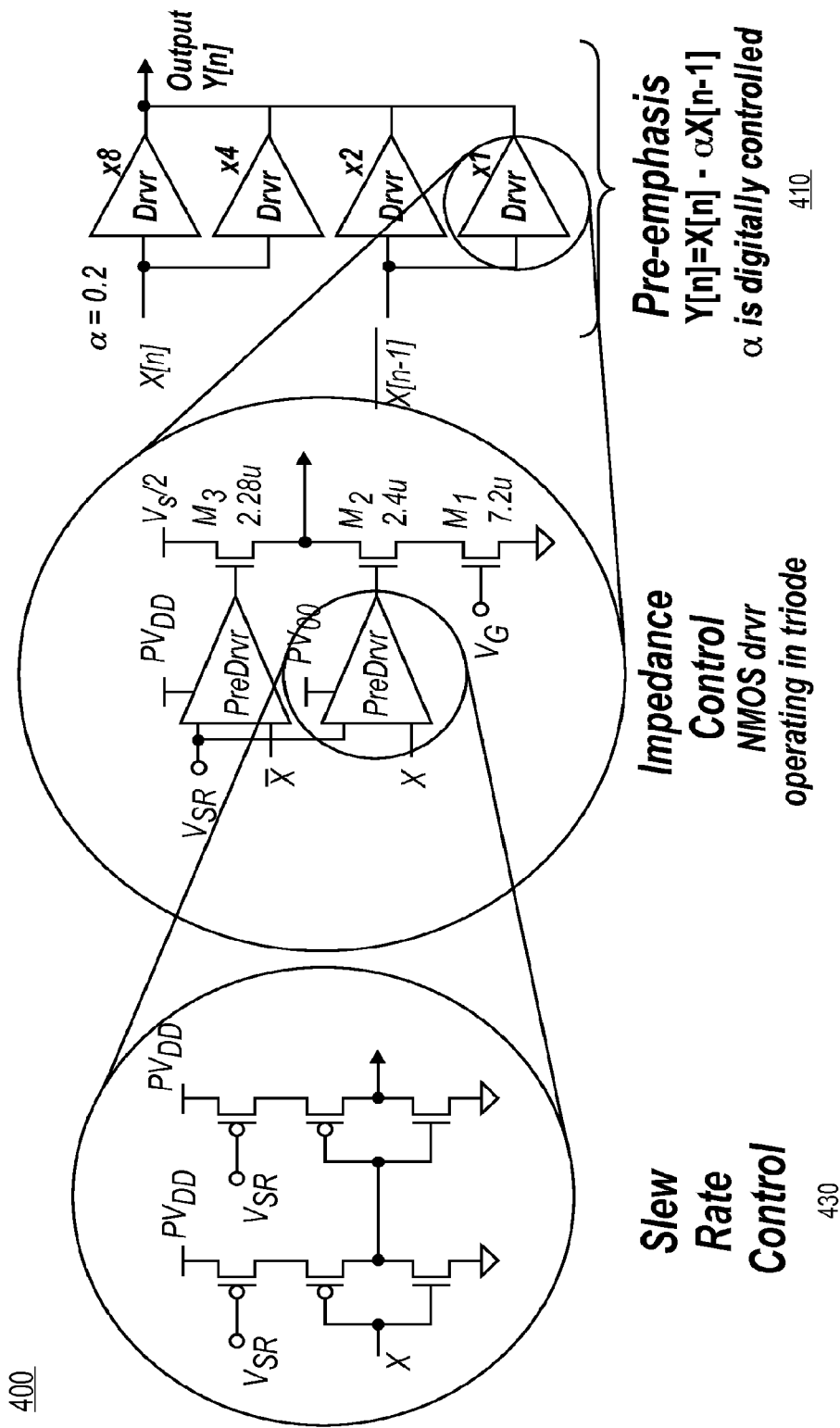
FIG. 4 is an illustration of elements of a driver system structure.

FIG. 4 is an illustration of elements of a driver system structure. In this illustration, a low supply voltage may be utilized to reduce power. However, this voltage supply is generated from a switching regulator that is external to the chip. In operation, there is a challenge in enabling a driver to work properly with low voltage swing, derived from an on-chip regulator, and with a single-ended structure. In this illustration, the supply is Vs/2, which is not the standard $V_{DD}$, and the swing is Vs/4. Therefore, the output swing will be dependent on an external supply.

In this illustration, slew rate control 430 is achieved by impedance control 420 involving the control of the PMOS (P-type metal-oxide-semiconductor) device resistance by adjusting a gate voltage $V_{sr}$. Pre-emphasis 410 is achieved by replicating the same unit driver and inputting past and present samples through each driver.

In this illustration, the output resistance of the driver is controlled by having the predriver (PreDrvr) swing between zero and PVDD. PVDD is set based on the resistance of the NMOS (N-type metal-oxide-semiconductor) devices (dependent on $V_{gs}$ of the NMOS). The NMOS transistors in the final stage operate only in the triode region (resistive region). In contrast, in some embodiments devices operate in both triode and current source modes, depending on the transistor.

Figure 5:
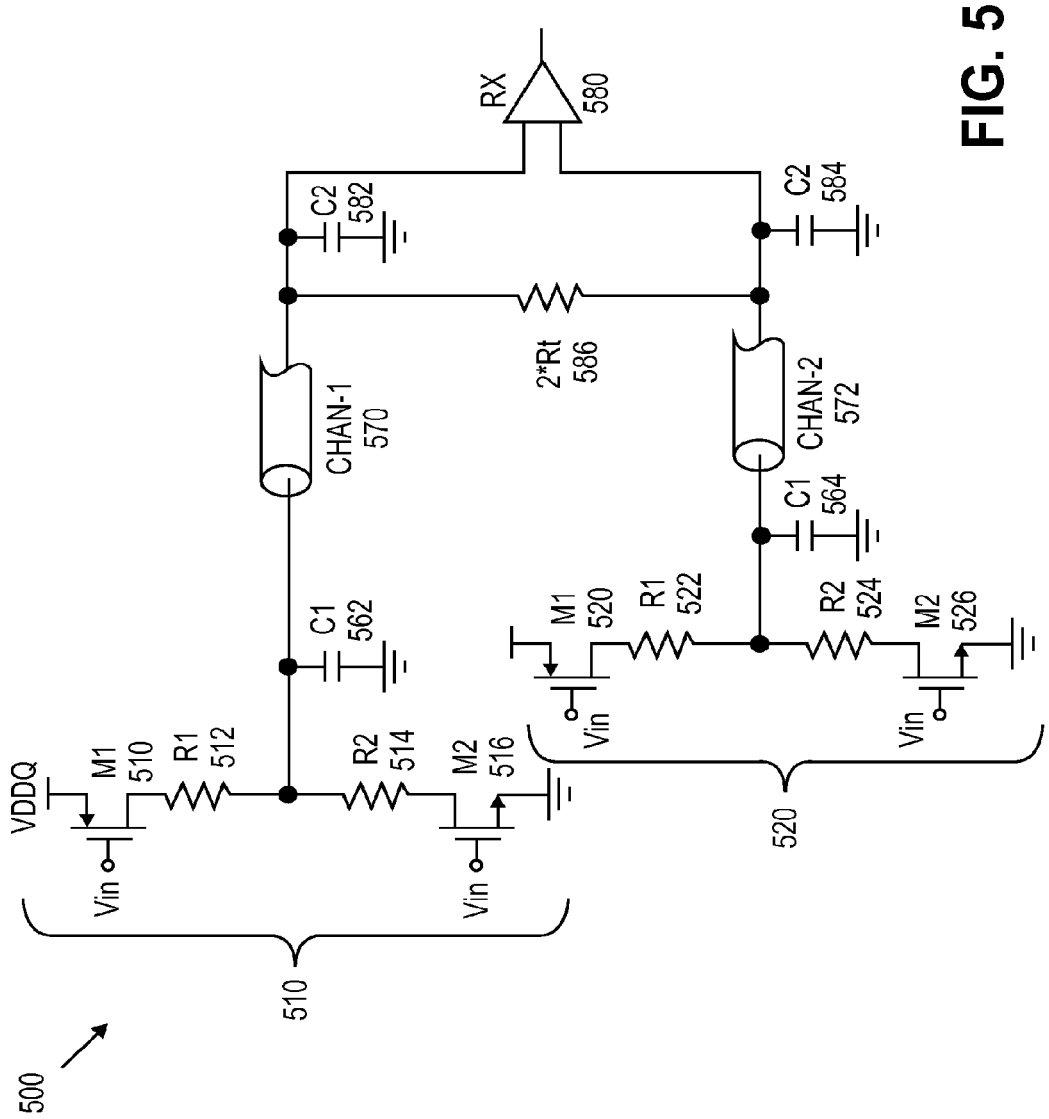
FIG. 5 illustrates a voltage-mode differential driver.

FIG. 5 illustrates a voltage-mode differential driver. Differential structures may be used to mitigate supply bounce and common-mode noise. FIG. 5 illustrates one possible voltage-mode differential driver implementation. In this illustration, a driver 500 includes a first differential structure 510 and a second differential structure 520. The first differential structure 510 is coupled with a receiver (RX) 580 via a first channel (CHAN-1) 570 and the second differential structure 520 is coupled with the receiver 580 via a second channel (CHAN-2) 572. The channel connection of each of the differential structures is coupled with ground via a first capacitor (C1) 562 and 564, and each of two inputs to the receiver 580 is coupled with ground by a second capacitor (C2) 582 and 584. Each of the differential structures includes a first transistor (M1) 510 or 520 as a switch between a voltage VDDQ and a first end of a first resistor (R1) 512 or 522, where a second end of the first resistor 512 or 522 is coupled with the channel 570 or 572. Each of the differential structures further includes a second transistor (M2) 516 or 526 as a switch between ground and a first end of a second resistor (R2) 514 or 524, wherein a second end of the second resistor 514 or 524 is coupled with the channel 570 or 572.

In this structure, the net current drawn from the supply is constant, irrespective of the bit state, thus mitigating supply bounce. The static current is given by VDDQ/4R (where, for example, R1=R2=Rt=R), which, for R=50 ohms and VDD=1.2 V, provides for a current draw of 6 mA. Although the apparatus illustrated in FIG. 5 consumes half the power of an equivalent single-ended structure (for the same voltage swing), the driver is required to operate at double the speed of the single-ended structure to maintain the same per pin bandwidth efficiency. At higher speeds, the channel requirements may pose undue constraints in many applications. In addition, the voltage swings are not easily configured or programmed, and hence power dissipation is not easily adaptable with data speeds.

Figure 6:
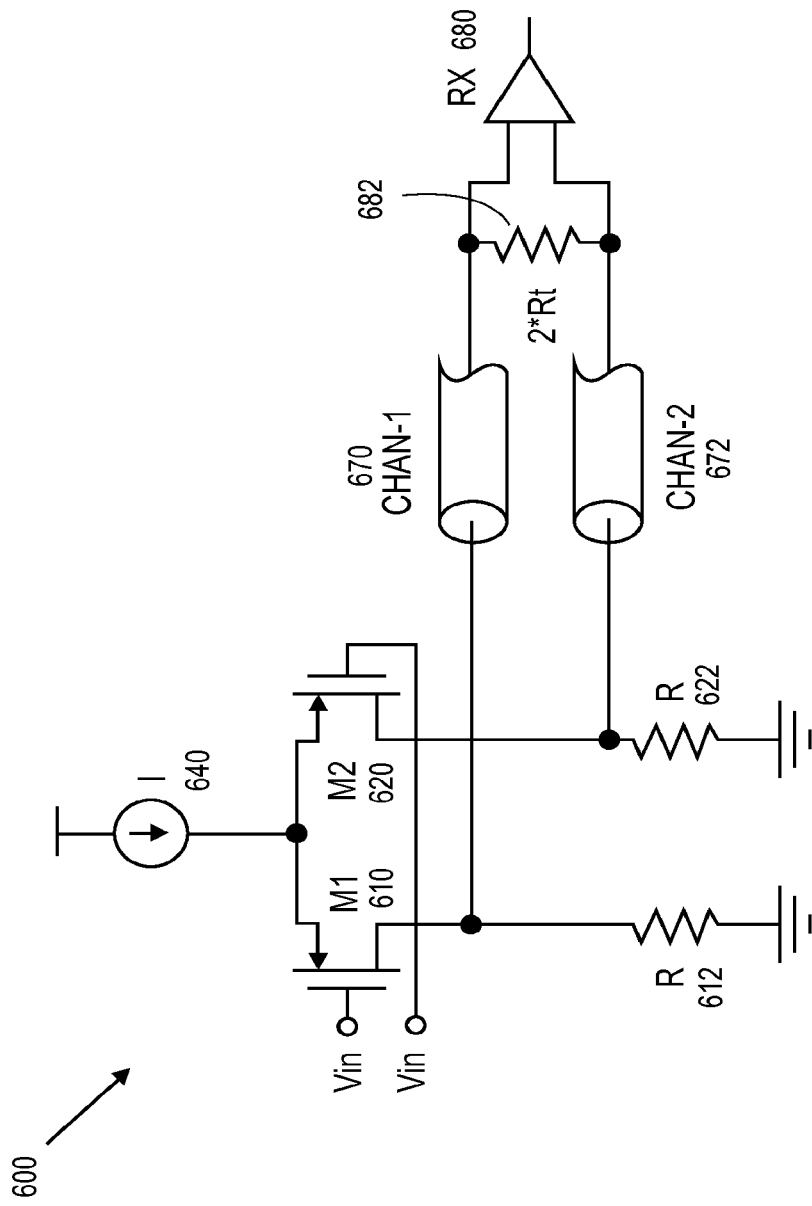
FIG. 6 illustrates a current-mode logic driver.

FIG. 6 illustrates a current-mode logic (CML) driver. In this illustration, a current source (I) 640 is coupled with a first end of a first transistor (M1) 610 and a second transistor (M2) 620, where a second end of the M1 610 is coupled with a first channel (CHAN-1) 670 and with a first end of a resistor (R) 612, the second end of R 612 being coupled with ground, where a second end of M2 620 is coupled with a second channel (CHAN-2) 672 and with a first end of a resistor (R) 622, the second end of R 622 being coupled with ground. A first end of a receiver (RX) 680 is coupled with CHAN-1 670 and a first end of a termination resistor (2*Rt) 682, and a second end of RX 680 is coupled with CHAN-2 672 and a second end of the termination resistor 682.

Current-mode logic drivers can provide flexibility to modify swings with current, and thus such drivers are commonly used. However, a CML driver, such as driver 600, draws a static current irrespective of the state of the output. For this reason, the CML driver is generally not suitable for applications where the data is transmitted in bursts.

Figure 7:
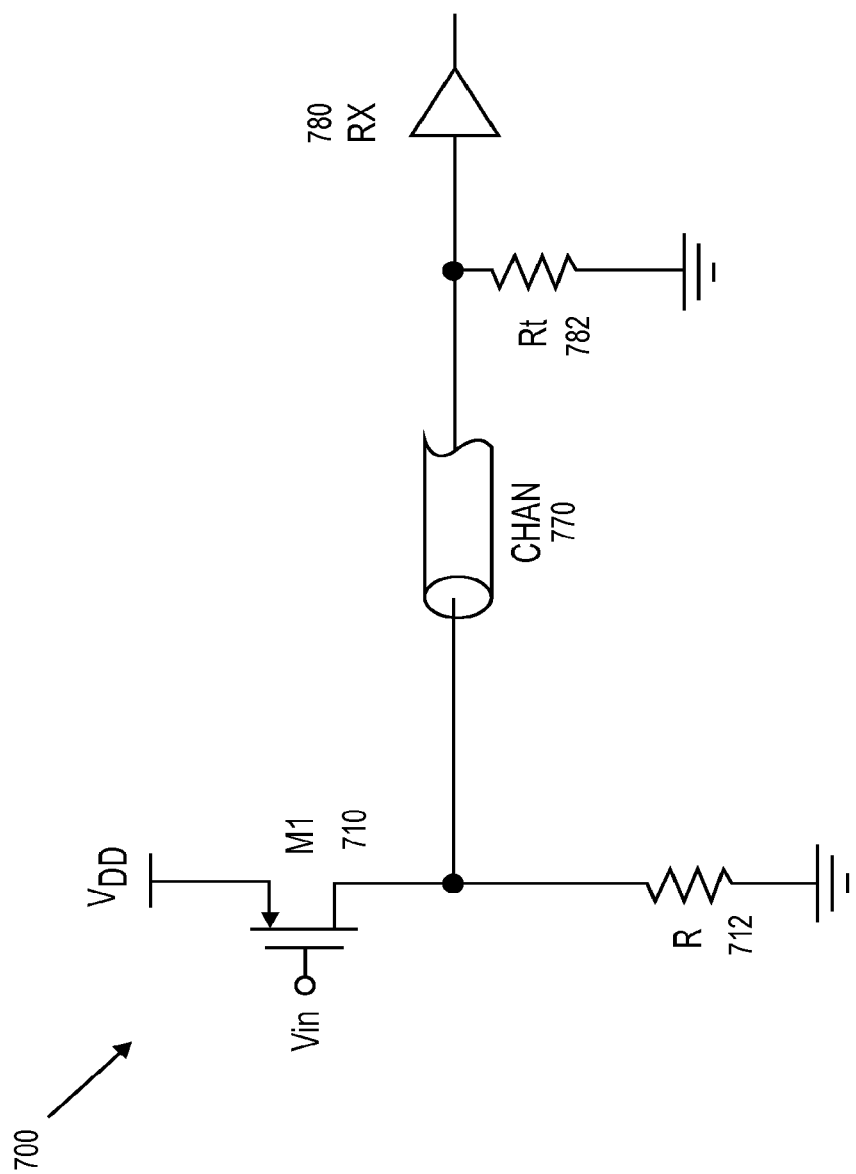
FIG. 7 illustrates a single ended current-mode driver.

FIG. 7 illustrates a single ended current-mode driver. In this illustration, a first end of a transistor (M1) 710 is coupled with a voltage source $V_{DD}$ and a second end of M1 710 is coupled with a channel (CHAN) 770 and with a first end of a resistor (R) 712, the second end of R 712 being coupled with ground. A first end of a receiver (RX) 780 is coupled with CHAN 770 and a first end of a termination resistor (Rt) 782, with a second end of Rt 782 being coupled with ground. However, a single-ended current-mode driver such as driver 700 generally consumes twice as much current as a differential driver, such as driver 600 illustrated in FIG. 6, for similar voltage swings, and thus has significant limitations.

In some embodiments, a driver includes elements to allow for improvements in operation in comparison with conventional drivers. In some embodiments, driver include elements to reduce power consumption and provide improved bandwidth efficiency per pin, thereby reducing the effective swing (or current) in the driver and providing more of available current in the driver to an attached load.

Figure 8A:
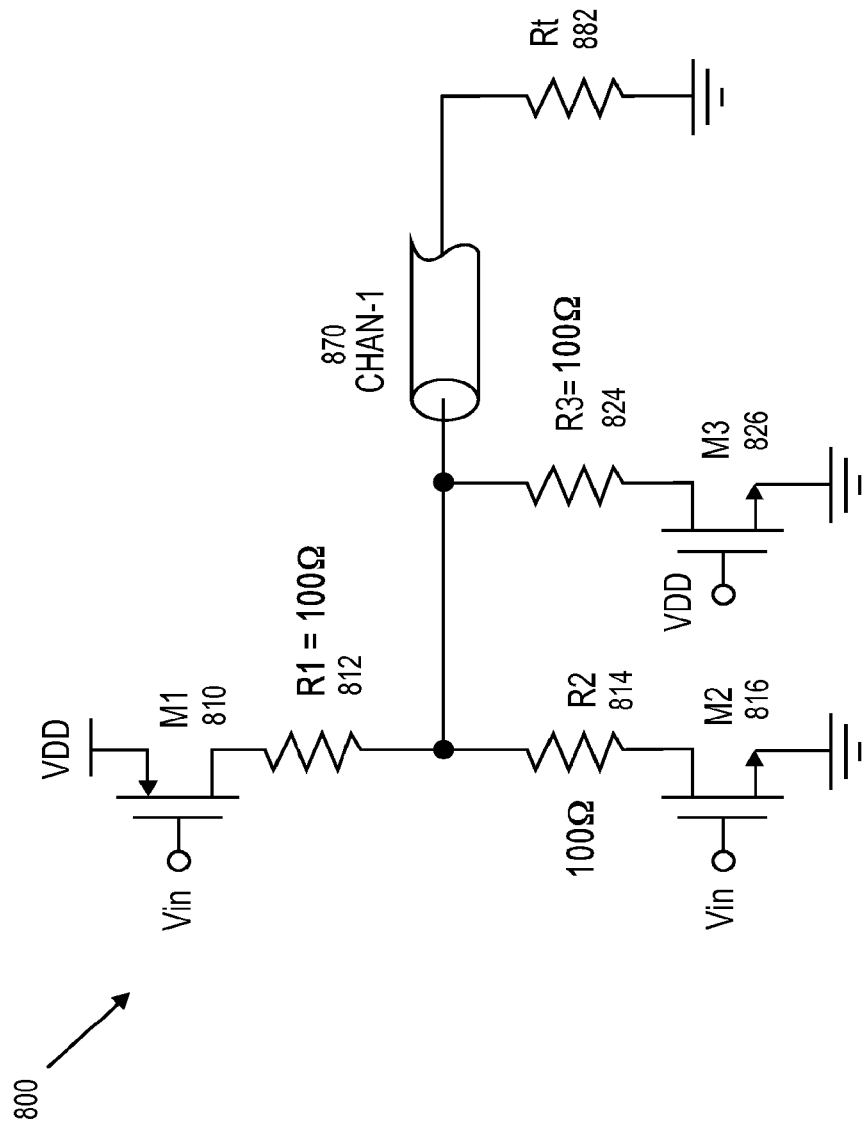
FIG. 8A illustrates an embodiment of a configurable single-ended driver structure.

FIG. 8A illustrates an embodiment of a configurable single-ended driver structure. In this illustration, a driver 800 (which may be referred to herein as a Type I driver) is coupled with a receiver apparatus including a termination resistance (Rt) 882 via a channel (CHAN) 870. Driver 800 includes a first transistor (M1) acting as a switch between a voltage $V_{DD}$ and a first end of a first resistor (R1) 812, where a second end of R1 812 is coupled with a transmitter side of CHAN 870. Driver 800 further includes a second transistor (M2) 816 acting as a switch between ground and a first end of a second resistor (R2) 814, with a second end of R2 814 being coupled with CHAN 870. In some embodiments, driver further includes a third transistor (M3) 826 acting as a switch between ground and a first end of a third resistor (R3) 824, with a second end of R3 824 being coupled with CHAN 870.

In some embodiments, transistors M1 810 and M3 826 operate as switches whereby a voltage division between the series connection of M1/R1 and M3/R3 may be utilized to set a voltage swing at the driver output. By providing a voltage swing that may be set independently of the supply (by adjusting the resistance values) the output voltage, and hence the power dissipation, may be minimized to suit a particular interface. In some embodiments, the structure provided in FIG. 8A operates without requiring a bias voltage, and may be utilized in applications where startup time is critical. In some embodiments, the driver 800 may be used to provide an improved power dissipation efficiency compared to a single-ended current-mode driver.

While branches of the driver circuit, also referred to here as strings, are illustrated in FIG. 8A as singular strings, each of such strings may represent multiple parallel strings. In some embodiments, programmability and configurability of the driver apparatus 800 is provided by the multiple strings of transistors and resistors, where the driver 800 includes only those strings that provide the correct output impedance or current capability. In some embodiments, the multiple strings may be utilized to track PVT (Process, Voltage, Temperature) variations in a system. For example, in FIG. 8A, M1 810 and R1 812 represent the equivalent of numerous such strings. In some embodiments, the number of strings selected for the driver 800 depends on the configurability required for the driver. Further, the same is true for the M3 826/R3 824 string and the M2 816/R2 814 strings. In some embodiments, this concept is also true for strings contained in other circuit structures, such as illustrated in FIGS. 8B through 12.

In some embodiments, the driver 800 may operate with large Vt (threshold voltage) transistors, thus making the structure of driver 800 suitable for DRAM-type processes. The Type I driver 800 provides freedom to independently adapt the driver impedance (Z0) and the output voltage swing (Vdriverout). These parameters may be represented by the following equations, where M1 and M3 are simplified to be ideal switches:

$$Z0=R1//R3 \qquad [1]$$

$$Vdriverout=(R3//Rt)/(R3//Rt+R1) \qquad [2]$$

where // refers to resistors in parallel and Rt is assumed to match channel characteristic impedance In some embodiments, adjustments to R1 and R3 may be made to satisfy required Z0, Vdriverout, and power dissipation simultaneously, thereby allowing the circuit structure to be adapted to various applications.

Figure 8B:
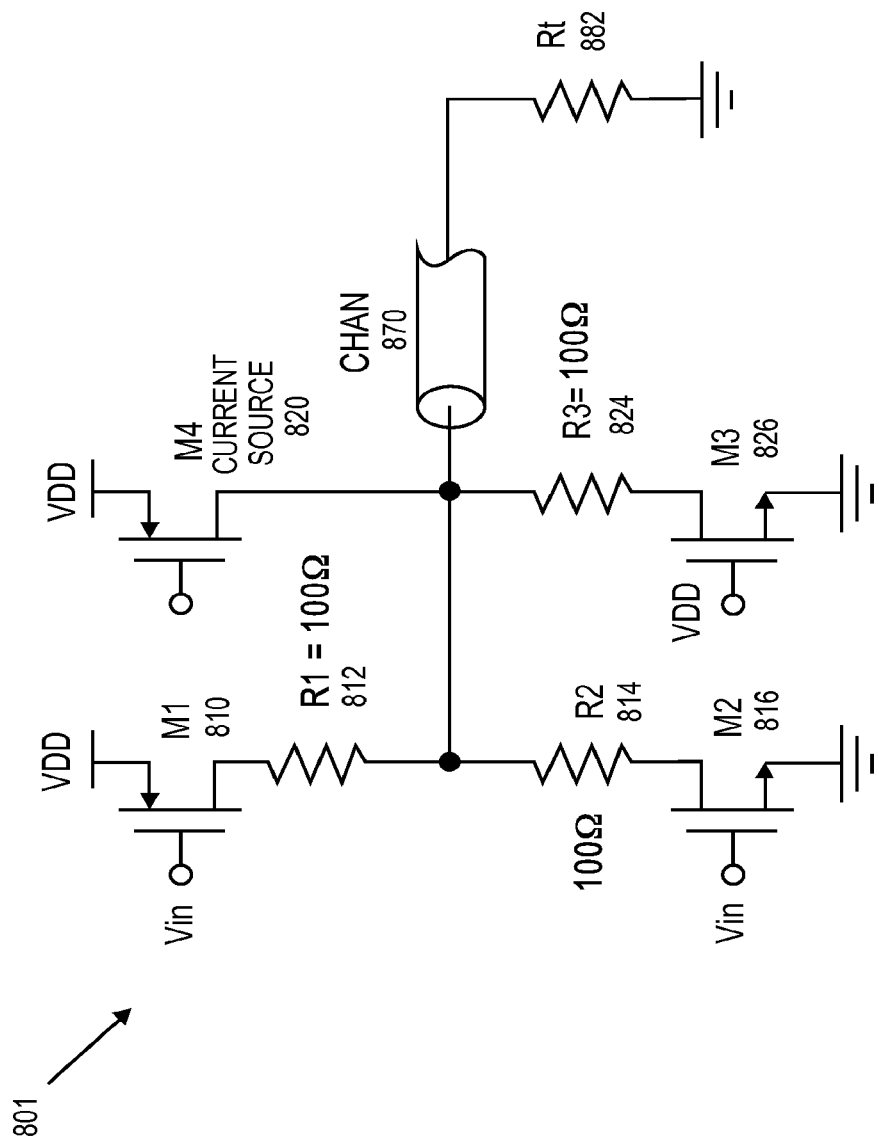
FIG. 8B illustrates an embodiment of a configurable single-ended driver structure with current source.

FIG. 8B illustrates an embodiment of a configurable single-ended driver structure with current source. In this illustration, in addition to the elements described above with regard to FIG. 8A, driver 801 (which is another version of the type-I driver) further includes a configurable current source 820 (where current source transistor M4 is the current source), where the current source is coupled with the transmitter side of CHAN 870. The current source 820 is illustrated as the current source transistor M4, where the mirroring element of the current source is not illustrated here. In some embodiments, the current source 820 may provide additional output current, if required. In some embodiments, the current source 820 of driver 801 is programmable in order to provide the current necessary.

In some embodiments, a high voltage for the driver 801 may be achieved by switching on the first transistor 810, second transistor 816, and current source transistor 820 and switching off the third transistor 826, where the high voltage value is defined by the ratio of R1 812 and R3 824 and the current from current source 820. In some embodiments, a low voltage for the driver 801 may be achieved by switching off the first transistor 810, the second transistor 814, and the current source transistor 820, and switching on the third transistor 826. In some embodiments, the value of the termination in the high voltage state is set by the equivalent parallel resistance of R1 and R3, while the termination in the low voltage state set by R2.

In some embodiments, the equivalent resistance of R1 812, R2 814 and R3 824 may be derived from using multiple parallel strings of the units illustrated, as described above with regard to FIG. 8A, and thus R1, R2, and R3 are effectively variable by enabling one or more of the parallel strings. In an example, the string of M1 810 and R1 812 may be the equivalent of multiple parallel strings of resistances and transistors, where FIG. 8B provides an equivalent representation of the multiple strings. This is also true for the other strings illustrated, such as the string including M2 816 and R2 814 and the string including M3 826 and R3 824. In some embodiments, enablement of one or more of the multiple strings may be utilized to provide programmability for the termination resistance.

Figure 9:
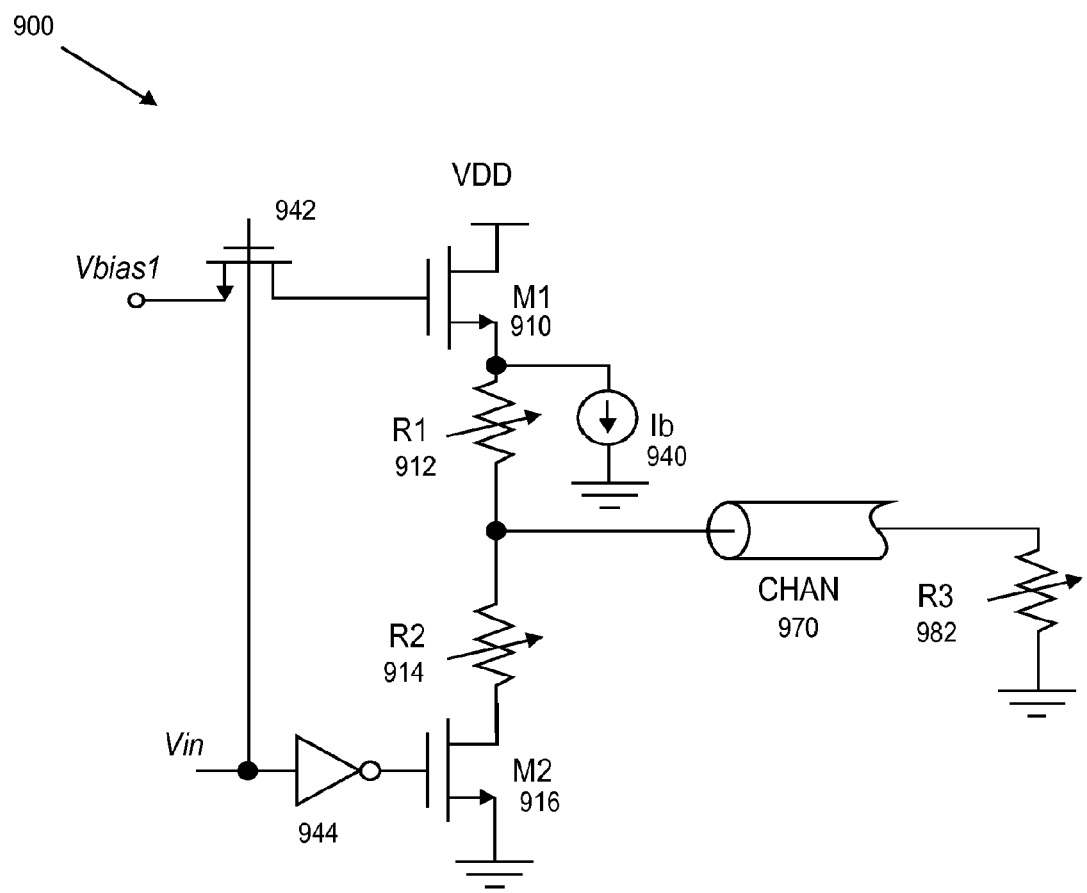
FIG. 9 illustrates an embodiment of a configurable single-ended voltage-mode driver.

FIG. 9 illustrates an embodiment of a configurable single-ended voltage-mode driver. In this illustration, a driver 900 (which may be referred to herein as a type-II driver) is a voltage-mode driver. In some embodiments, a first transistor (M1) 910 of the driver 900 acts as a source follower coupled with a terminal of transistor 942, where a second terminal of transistor 942 is coupled with a bias voltage Vbias1, and a second transistor (M2) 916 acts as a switch, the gate of M2 916 being coupled with inverter 944, which receives voltage Vin. As illustrated, a first terminal of M1910 is coupled with voltage $V_{DD}$ and a second terminal of M1 910 is coupled with a first end of a first variable resistor (R1) 912 and a bleeder current source (Ib) 940. A second end of R1 912 is coupled with a channel (CHAN) 970 and a first end of a second variable resistor (R2) 914. A second end of R2 914 is coupled with a first terminal of M2 916, with a second terminal of M2 916 being coupled with ground. Coupled with a receiver end of CHAN 970 is a third variable resistor (R3) 982 representing a termination resistance.

In this structure, an input to M1910 is biased to Vbias1 when the output is high and pulled to ground in the OFF state. In some embodiments, by regulating the value of Vbias1, the output swing of the driver 900 may be controlled to a minimum needed value, and hence the corresponding power dissipation may be reduced. For example, if a swing of 300 mV is needed at R3 982, then 6 mA of current is supplied by M1910, which is half the current and resulting power consumption of typical single ended solutions (for which the current would be 12 mA with 1.2 V $V_{DD}$ in this example). In this system, the output impedance of the driver 900 is the sum of R1 and the small/large signal impedance seen at the source of M1 910. In some embodiments, the effect of variation in small/large signal impedance may be mitigated by utilizing a large R1 912 value relative to the source impedance of M1910. In some embodiments, the bleeder current source Ib 940 provides additional flexibility in adjusting the bias points of M1. In some embodiments, the Ib current is a fraction of the overall current, and in zero state only M2 and R2 are conducting to ground and hence the driver 900 has essentially no static current.

Figure 10:
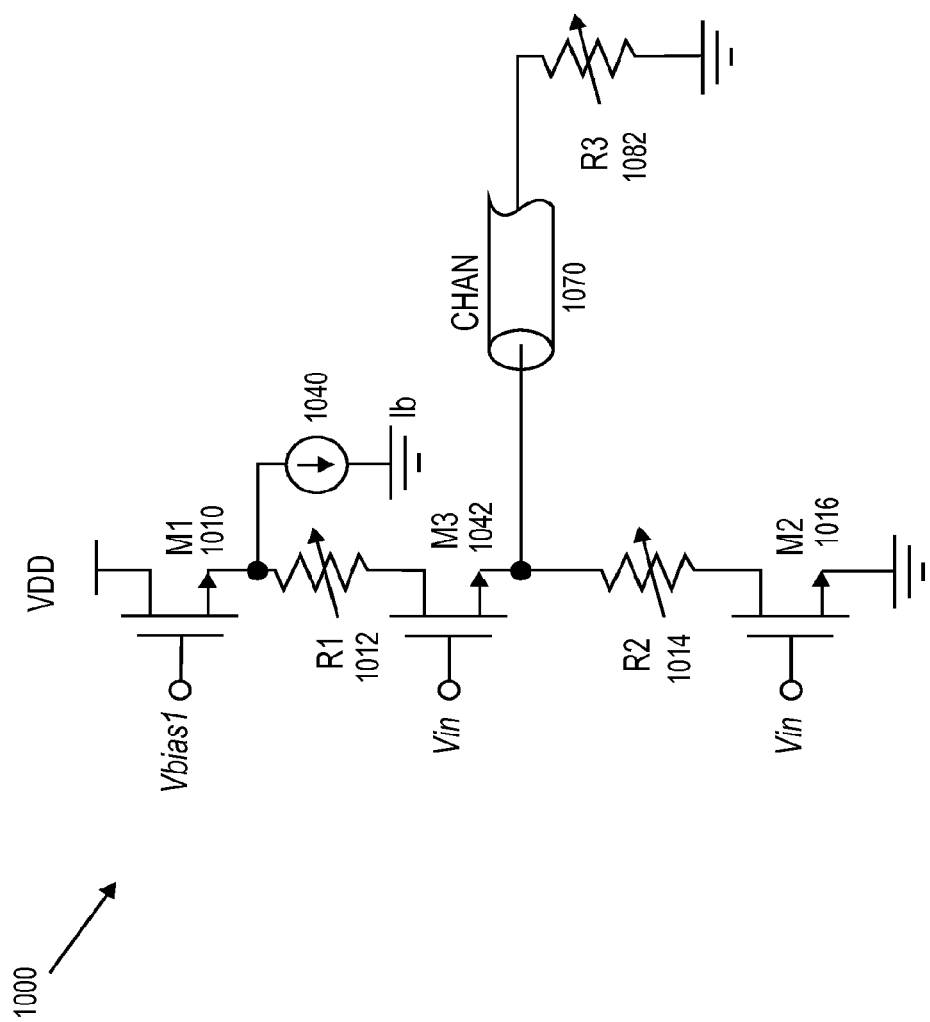
FIG. 10 is illustrates an embodiment of a configurable single-ended voltage-mode driver.

FIG. 10 illustrates an embodiment of a configurable single-ended voltage-mode driver. FIG. 10 illustrates a modified form of type-II voltage-mode driver 1000. In some embodiments, a first terminal of a first transistor (M1—receiving bias voltage Vbias1) 1010 is coupled with voltage $V_{DD}$ and a second terminal of M1 1010 is coupled with a first end of a first variable resistor (R1) 1012 and a bleeder current source (Ib) 1040. A first terminal of a second transistor (M2—receiving input signal Vin) 1016 is coupled with a first end of a second variable resistor (R2) 1014. A second end of R1 1012 is coupled with a first terminal of a third transistor (M3—receiving input signal Vin) 1042, with a second terminal of M3 1042 being coupled with a first end of a channel (CHAN) 1070 and a first second of R2 1014. Coupled with a second end of CHAN 1070 is a third variable resistor (R3) 1082.

In this implementation, the switch M3 1042 is in series with M1 1010. In some embodiments, the functionality of the illustrated Type-II driver may include the functionality of a type-I driver. In some embodiments, the structure illustrated in FIG. 10 would also be suitable for drivers that do not include a termination resistance on the receiver side. In this scenario, the bleeder current source Ib 1040 may be utilized to ensure that transistor M1 1010 is always on with suitable overdrive voltage.

In some embodiments, a voltage swing and a termination resistance of the driver 1000 are configurable by adjustment of resistance of the first variable resistor 1012 and the second variable resistor 1014. In some embodiments, the voltage swing is further defined by the bias voltage Vbias1. In some embodiments, transistors M3 1042 and M2 1016 operate in a complementary fashion. For example, when M3 is on, M2 is ideally off, and vice versa.

Figure 11:
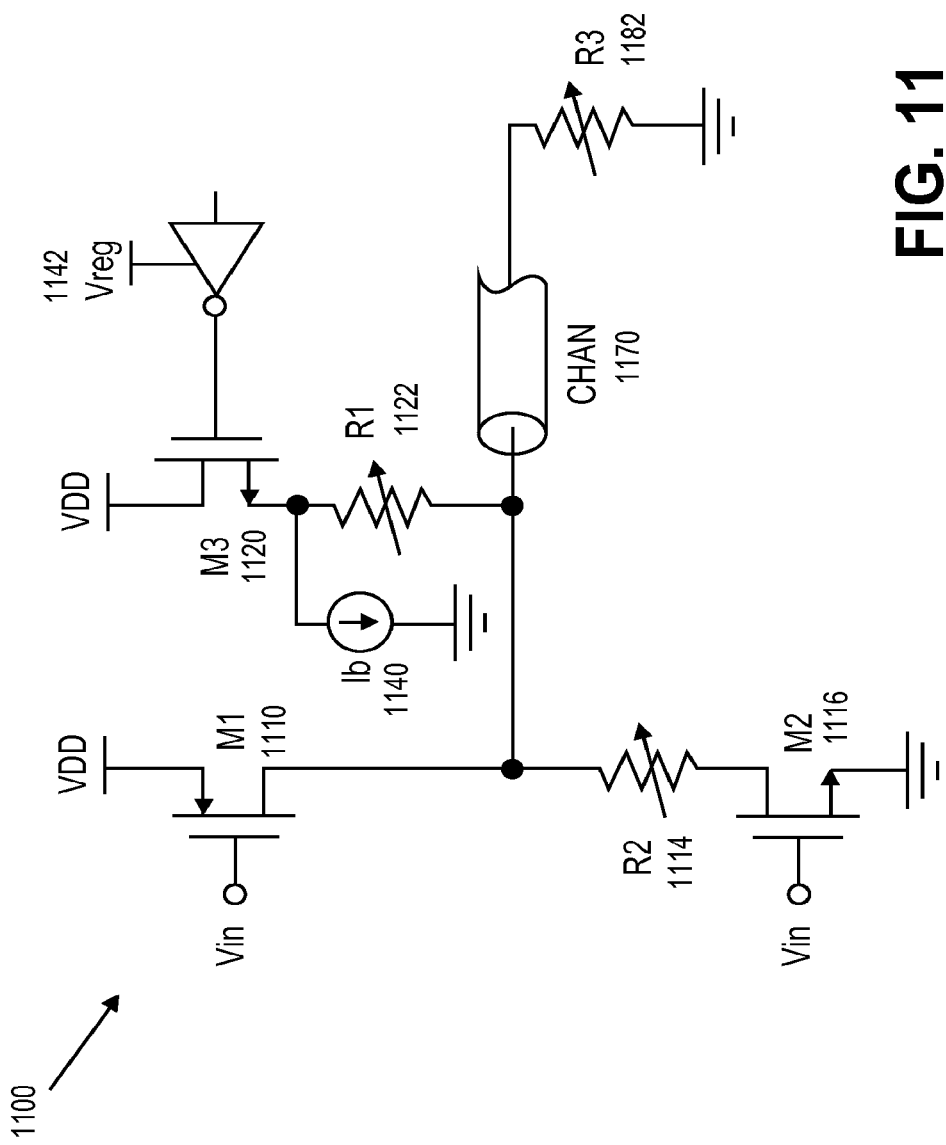
FIG. 11 is an illustration of an embodiment of a configurable single-ended mixed mode driver.

FIG. 11 is an illustration of an embodiment of a configurable single-ended mixed mode driver. In this illustration, a "type-III" mixed voltage-mode current-mode driver is provided. In some embodiments, a driver 1100 includes a first transistor (M1) 1110 with a first terminal coupled with voltage $V_{DD}$ and a second terminal coupled with a first end of a first variable resistor (R1) 1122, a first end of a second variable resistor (R2) 1114, and a first transmitter end of a channel (CHAN) 1170. In some embodiments, a second end of R2 1114 is coupled with a first terminal of a second transistor (M2) 1116, with a second terminal of M2 1116 being coupled with ground. In some embodiments, a third transistor (M3) 1120 includes a first terminal coupled with $V_{DD}$ and a second terminal coupled with a second end of R1 1122 and a bleeder current source (Ib) 1140, with the gate of M3 1120 being coupled with an inverter 1142.

In some embodiments, M1 1110 acts as a switching current source during an ON state. Further, the input to M3 is swing regulated by the inverter 1142, whose supply voltage is regulated to a reference voltage ($V_{REF}$), thus controlling the voltage swing at the output of the driver 1100. In some embodiments, M1 1110 may be removed from the driver circuit if the M3 leg provides adequate swing and termination control. In some embodiments, M1 1110 may be utilized as a de-emphasis tap providing a required current during a transition to compensate for non-ideal channel effects. In some embodiments, a number of taps may be extended by including an additional number of strings (such as M1 1110) with appropriate de-emphasis taps (where such additional number of strings are not illustrated here). In some embodiments, the illustrated structure can be inverted such that the swings are not referenced to ground but with reference to $V_{DD}$.

Figure 12:
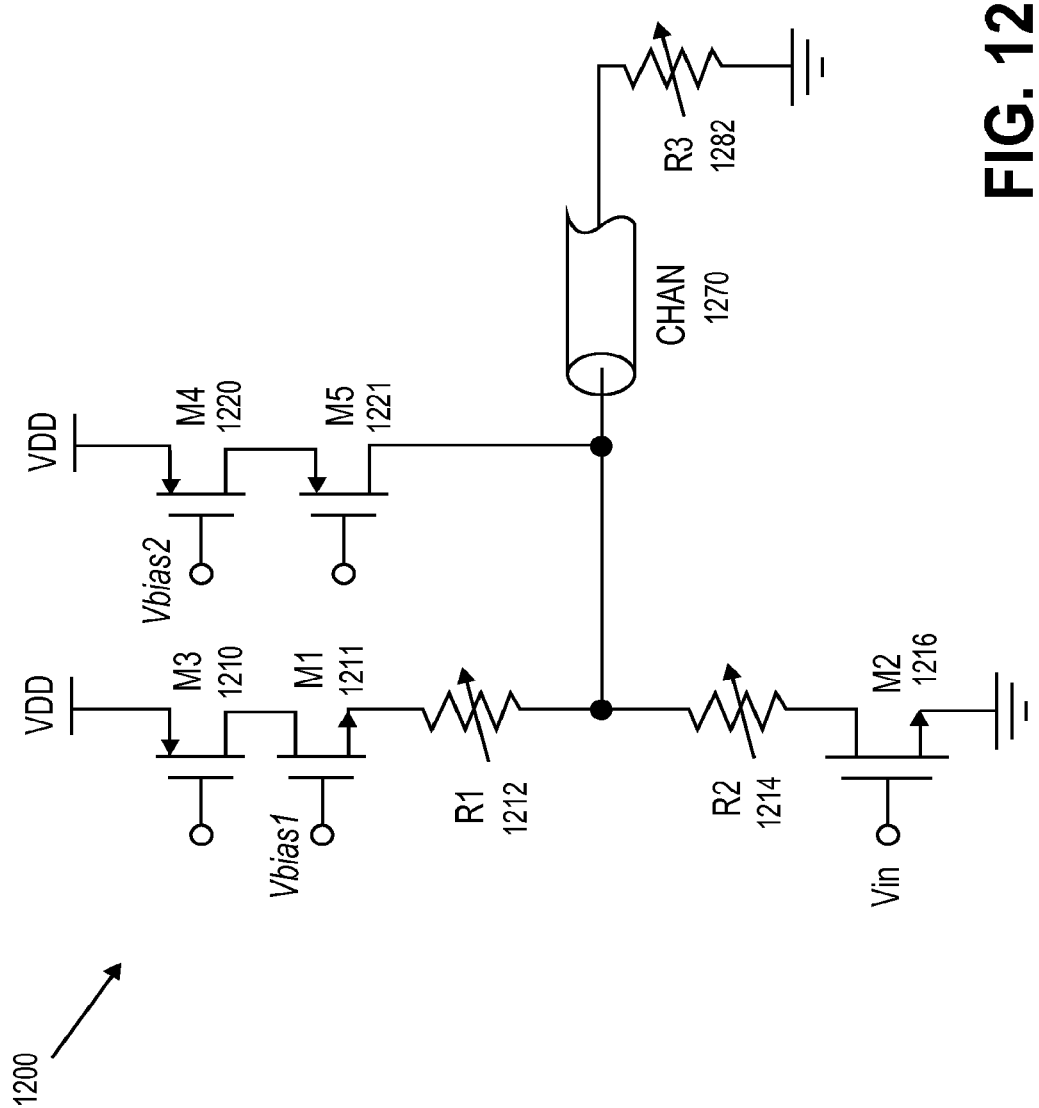
FIG. 12 illustrates an embodiment of a configurable single-ended mixed mode driver.

FIG. 12 illustrates an embodiment of a configurable single-ended mixed mode driver. In this illustration, an embodiment of a modified version of type-II and type-III mixed-mode driver 1200 is provided. In some embodiments, the driver 1200 includes a first transistor (M1) 1211 (receiving bias voltage Vbias1) with a first terminal coupled with a first end of a first variable resistor (R1) 1212. A second end of R1 1212 is coupled with a transmitter end of a channel (CHAN) 1270 and a first end of a second adjustable resistor (R2) 1214. A second end of R2 1214 is coupled with a first terminal of a second transistor (M2) 1216, where a second terminal of M2 1216 is coupled with ground. A second terminal of M1 1211 is coupled with a first terminal of a third transistor (M3) 1210, a second terminal of M3 1210 being coupled with voltage $V_{DD}$. A fourth transistor (M4) 1220 (receiving bias voltage Vbias2) includes a first terminal coupled with voltage $V_{DD}$ and a second terminal coupled with a first terminal of a fifth transistor (M5) 1221, where a second terminal of M5 1221 is coupled with the first end of CHAN 1270. A second end of CHAN 1270 is coupled with an adjustable termination resistance (R3) 1282. In some embodiments, M4 1220 operates as a current source, M1 1211 operates as a source follower, and M3 1210 and M5 1221 operate as switches.

In some embodiments, a driver, such as one of the drivers illustrated in FIGS. 8A through 12, may provide the following benefits:

(1) All the current supplied by the driver (other than leakage currents) is provided to the load, thereby reducing power dissipation.

(2) Voltage swings may be configured or programmed to reduce power dissipation, based on system requirements.

(3) Termination resistance may be configured or programmed based on system requirements.

(4) Voltage swings may be de-coupled from the value of the supply voltage.

(5) Drivers may be implemented with transistors that have large threshold voltages, especially in DRAM processes.

In some embodiments, certain additional issues regarding the driver circuits presented in FIGS. 8A through 12 relate to:

(1) Generation of bias voltages.

(2) Tracking of bias voltages with PVT (Process, Voltage, Temperature) variations.

(3) Control of impedance.

Figure 13:
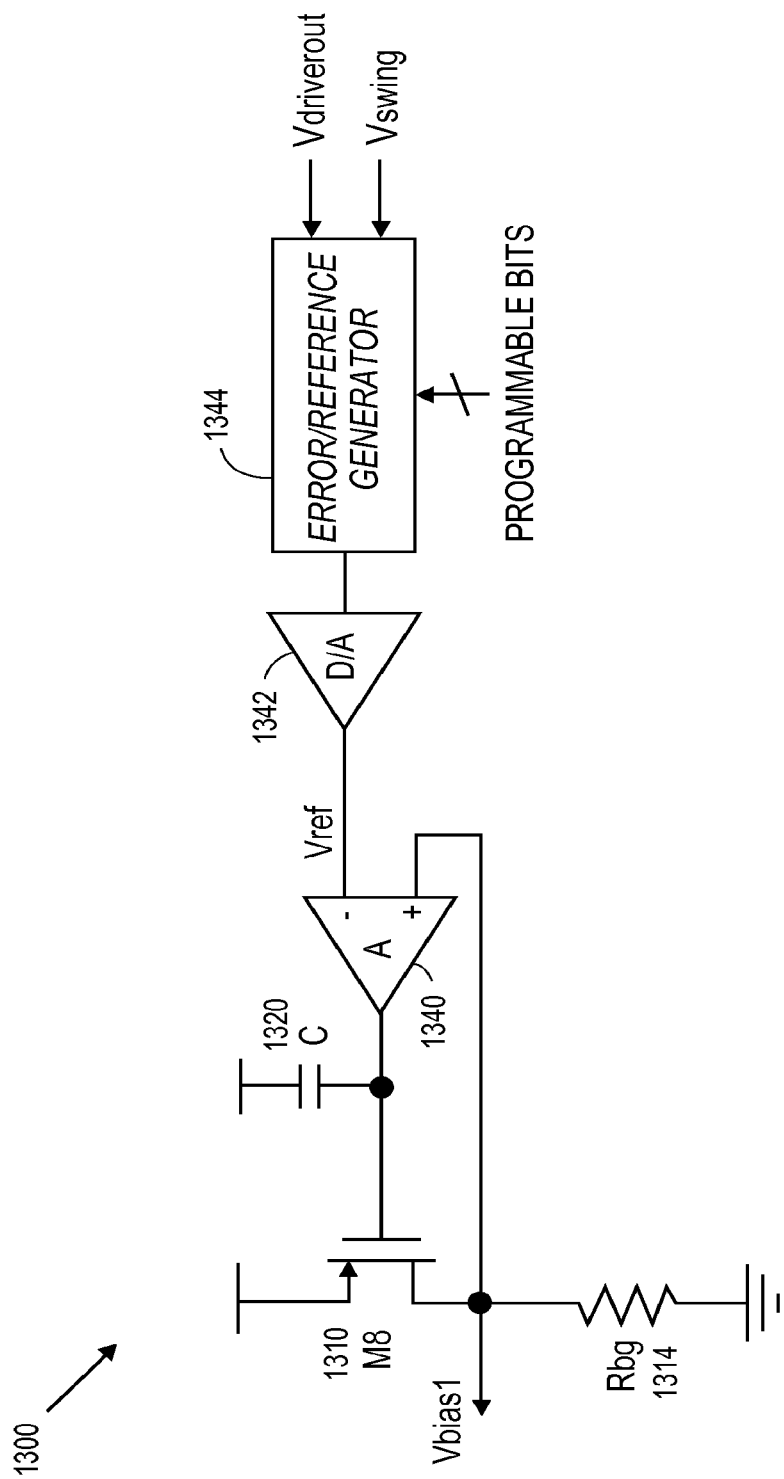
FIG. 13 is an illustration of an embodiment of a feedback circuit to generate a bias voltage for a configurable driver.

FIG. 13 is an illustration of an embodiment of a feedback circuit to generate a bias voltage for a configurable driver. In some embodiments, a bias voltage generator 1300 provides for comparison of an actual driver voltage (Vdriverout) with a required voltage swing (Vswing) at the output to control the bias voltage. In some embodiments, a generator circuit 1300 includes an error/reference generator 1344 that receives Vdriveout and Vswing as comparison inputs. In some embodiments, the error/reference generator further receives an input of certain programmable bits that provide flexibility in controlling the reference generator output. In the generator circuit 1300, the error voltage between Vdriveout and Vswing is provided to a digital-to-analog converter 1342 to generate a Vref value as a first input to a amplifier 1340, where the output of the amplifier is coupled with a first terminal of capacitor C 1320 and to a gate of a transistor (M8) 1310, with a first terminal of M8 being coupled with voltage $V_{DD}$ and a second terminal of M8 1310 being coupled with an output node for bias input Vbias1 for a driver, the node being further coupled with a second input of amplifier 1340 and to a first end of resistor Rbg 1314, wherein a second end of Rbg is coupled with ground. In some embodiments, a voltage may be referenced to a source voltage $V_{DD}$ as well as being referenced to a ground potential.

In some embodiments, a method or apparatus may be provided to derive a DC voltage swing of a driver for a particular bias voltage (Vbias1). In first implementation, the actual driver is used to derive V driverout, while in a second implementation a replica driver circuit is used instead. Depending on a specific link implementation, either of the two methodologies may be adopted.

Figure 14:
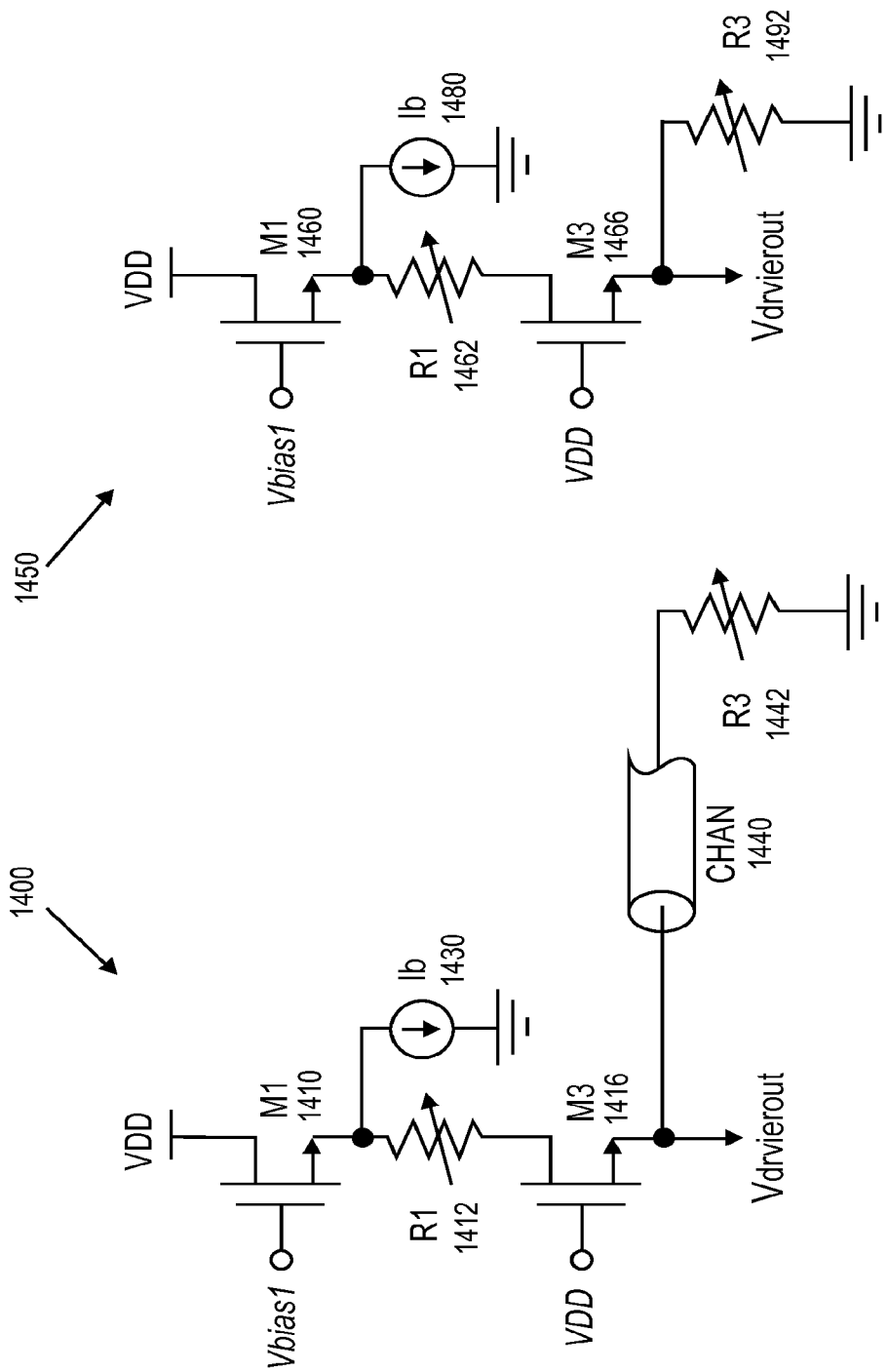
FIG. 14A is an illustration of an embodiment of an apparatus to derive a voltage swing for a bias voltage using a configurable driver circuit.
FIG. 14B is an illustration of an embodiment of an apparatus to derive a voltage swing for a bias voltage using a replica of a configurable driver circuit.

FIG. 14A is an illustration of an embodiment of an apparatus to derive a voltage swing for a bias voltage using a configurable driver circuit. In some embodiments, a bias voltage input Vbias1 is provided to a gate of a first transistor (M1) 1410 of a driver 1400, where a first terminal of M1 is coupled with voltage $V_{DD}$ and a second terminal of M1 is coupled with a first end of a first resistor (R1) 1412 and a bleeder current source (Ib) 1430. A second end of R1 1412 is coupled with a first terminal of a transistor (M3) 1416, where a gate of M3 is coupled with $V_{DD}$ and a second terminal of M3 is coupled with a node for output Vdriverout and a first end of a channel (CHAN) 1440. A second end of CHAN 1440 is coupled with a resistance (R3) 1442. In such circuit, the voltage swing of the output may be evaluated in relation to the input bias voltage Vbias1.

FIG. 14B is an illustration of an embodiment of an apparatus to derive a voltage swing for a bias voltage using a replica of a configurable driver circuit. In some embodiments, a bias voltage input Vbias1 is provided to a gate of a first transistor (M1) 1460 of a driver replica circuit 1450, where a first terminal of M1 is coupled with voltage $V_{DD}$ and a second terminal of M1 is coupled with a first end of a first resistor (R1) 1462 and a bleeder current source 1480. A second end of R1 1462 is coupled with a first terminal of a transistor (M3) 1466, where a gate of M3 is coupled with $V_{DD}$ and a second terminal of M3 is coupled with a node for Vdriverout and to a resistance (R3) 1492.

In some embodiments, a feedback mechanism to generate a bias voltage may be combined with a mechanism to derive a voltage swing, such as elements of the circuits illustrated in FIG. 13 and FIG. 14A, may be combined to provide a feedback structure that controls an output swing to a certain specified value of Vswing.

Figure 15:
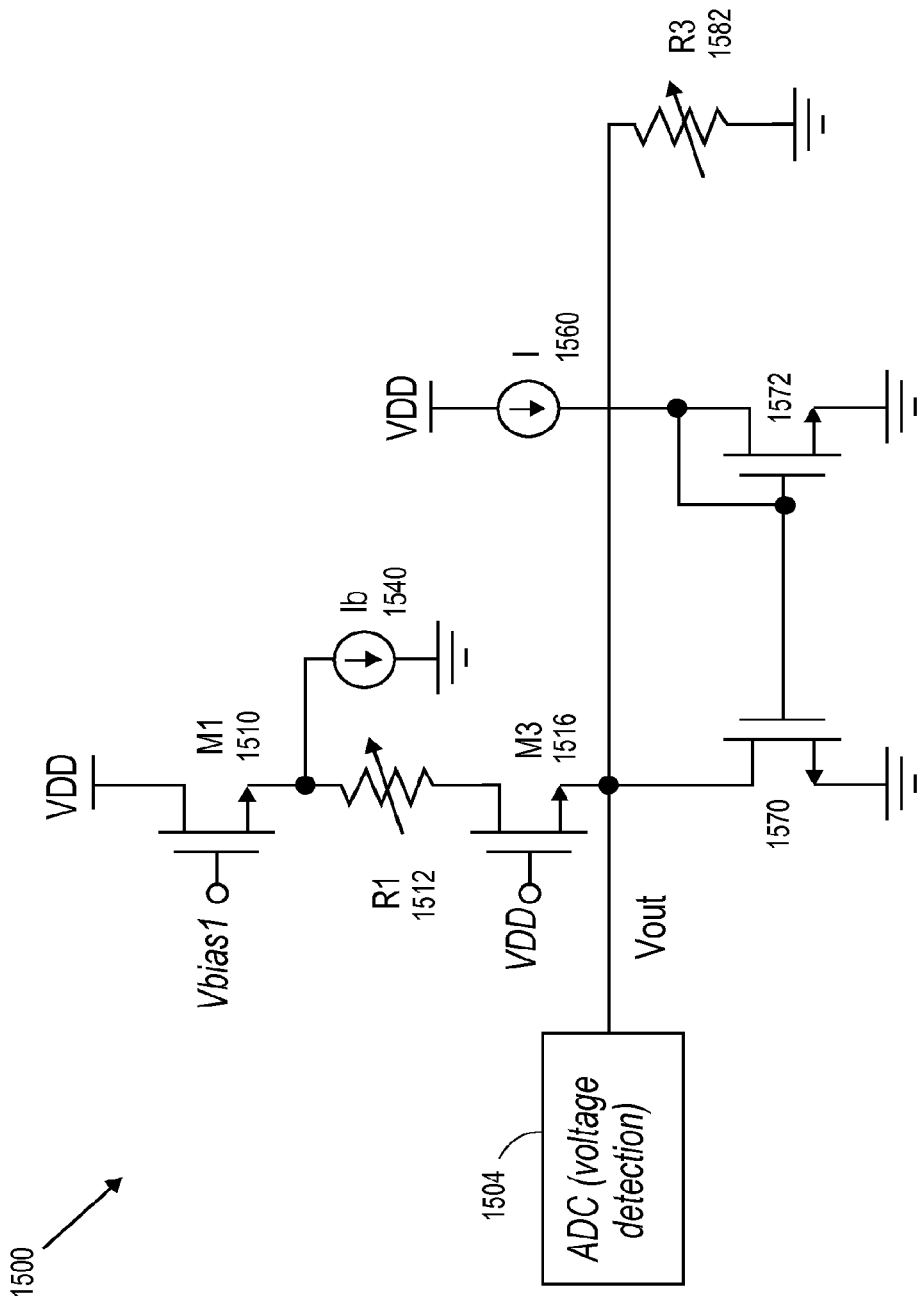
FIG. 15 illustrates an embodiment of an apparatus for impedance detection and adjustment for a configurable driver.

FIG. 15 illustrates an embodiment of an apparatus for impedance detection and adjustment for a configurable driver. For a driver, such as the drivers illustrated in FIGS. 8A-12, impedance detection and adjustment is very important for effective operation. FIG. 15 illustrates an embodiment of a mechanism to provide accurate adjustment of output impedance (resistance). In some embodiments, a bias voltage input Vbias1 is provided to a gate of a first transistor (M1) 1510 of a driver 1500, where a first terminal of M1 is coupled with voltage $V_{DD}$ and a second terminal of M1 is coupled with a first end of a first variable resistor (R1) 1512 and a bleeder current source (Ib) 1540. A second end of R1 1512 is coupled with a first terminal of a transistor (M3) 1516, where a gate of M3 is coupled with $V_{DD}$ and a second terminal of M3 is coupled with a node for Vout. In some embodiments, the Vout node is coupled with a voltage detector in the form of an analog to digital detector 1504 and to variable termination resistance (R3) 1582, and to a current mirror circuit comprising transistor 1570 coupled with transistor 1572, transistor 1572 receiving a current from a current source (1) 1560.

In some embodiments, the voltage detector in FIG. 15 is a low-frequency analog to digital converter that may assist in the calibration process of impedance adjustment. In some embodiments, the calibration procedures may be done in tandem to set the right calibrated values for Vbias1, Ib and R1, thus achieving the right swing voltage and impedance simultaneously.

Figure 16:
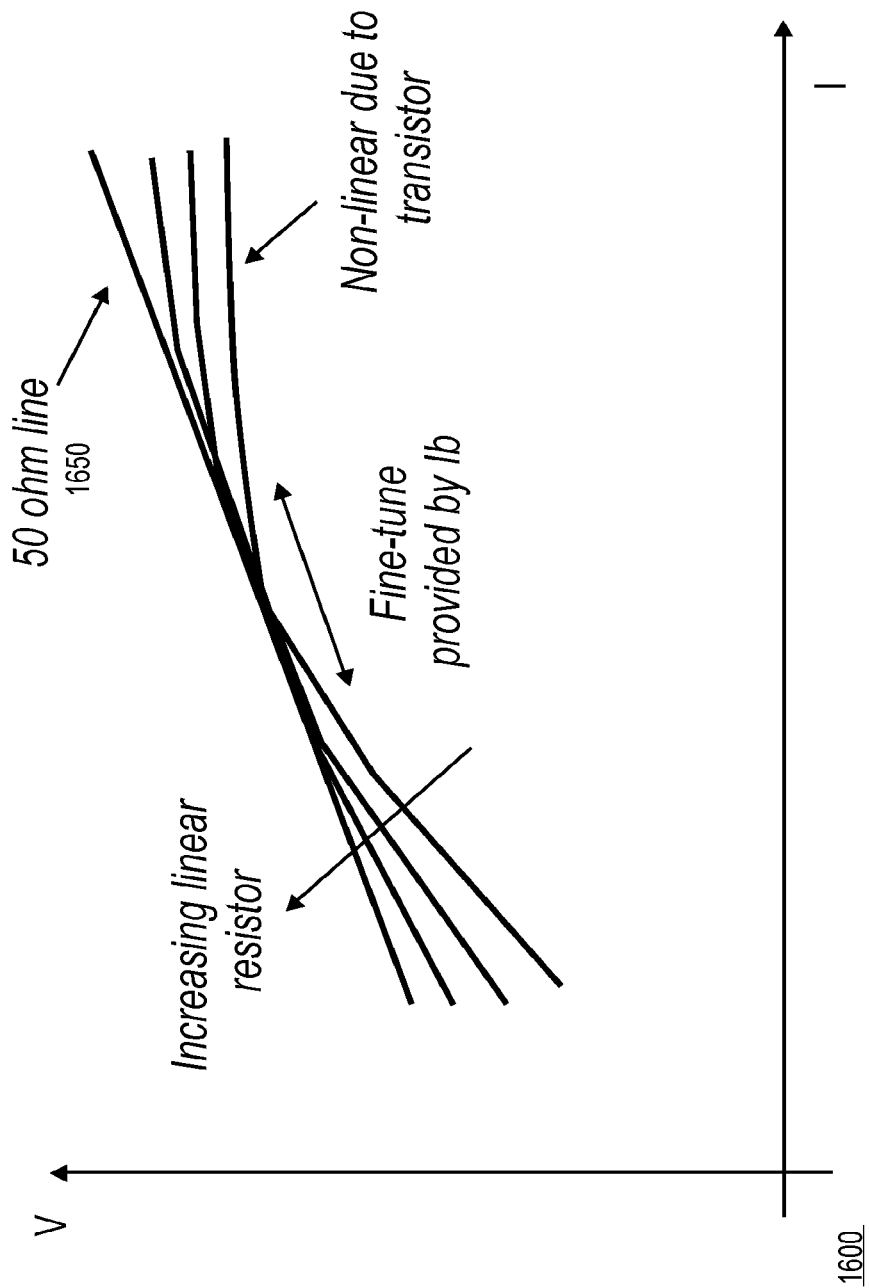
FIG. 16 is an illustration of impedance characteristics of certain drivers.

FIG. 16 is an illustration of impedance characteristics of certain drivers. In this illustration, the impedance characteristics 1600 of a driver are shown to vary depending on the linear resistance of the impedance provided by the transistor and resistor of the driver, with increasing linear resistance providing a relationship closer to a linear (50-ohm) line 1650, and non-linearity increasing with the effect of the transistor. As shown, fine-tuning may be provided using a bleeder current source Ib.

For example, for a large linearity in driver 1500 illustrated in FIG. 15, resistance R1 1512 should be much larger than the impedance of M1 and vice versa. Dependence solely on R1 1512 to provide the required impedance results in high power dissipation in M1 1510. In some embodiments, a suitable division of impedance between R1 and M1 is sought. In some embodiments, the current characteristics of the driver are set by the swing requirements, such as provided in Figures. In some embodiments, the bleeder current source Ib 1540 provides additional flexibility in the tuning of the impedance of the transistor M1, providing an additional degree of freedom in this driver design.

Figure 17:
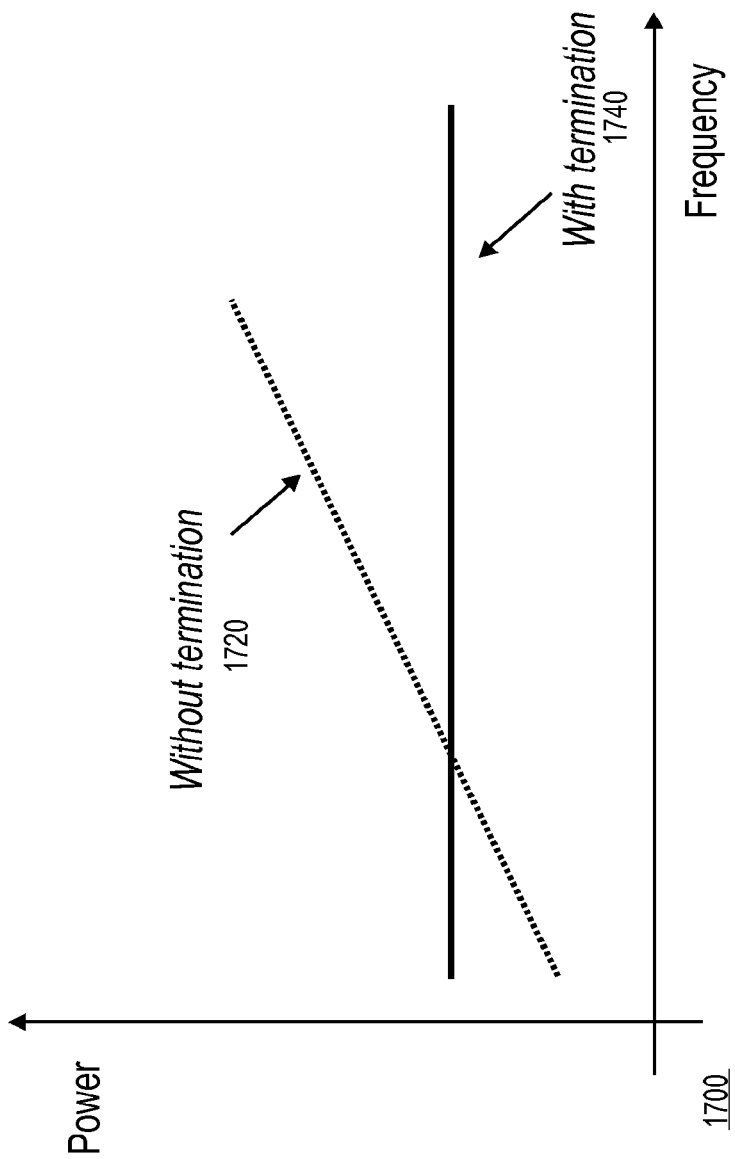
FIG. 17 is an illustration of speed versus power tradeoff for an embodiment of a driver.

FIG. 17 is an illustration of speed versus power tradeoff for an embodiment of a driver. As illustrated in the graph of frequency of operation versus power dissipation, a driver without termination resistance 1720 will require increasing power dissipation as frequency increases. However, a driver with termination resistance 1740 will require a generally small amount of power dissipation regardless of frequency. In some embodiments, the drivers presented above as Type-I, Type-II, and Type-III drivers (or hybrids of such types) generally consume power for high-states and consume no power (except for leakage current) in low states.

However, at low speeds an issue arises in that such a driver may be less conducive for low-speed operation because CMOS-based drivers with termination will tend to consume more power at low speeds than un-terminated counterparts.

Figure 18A:
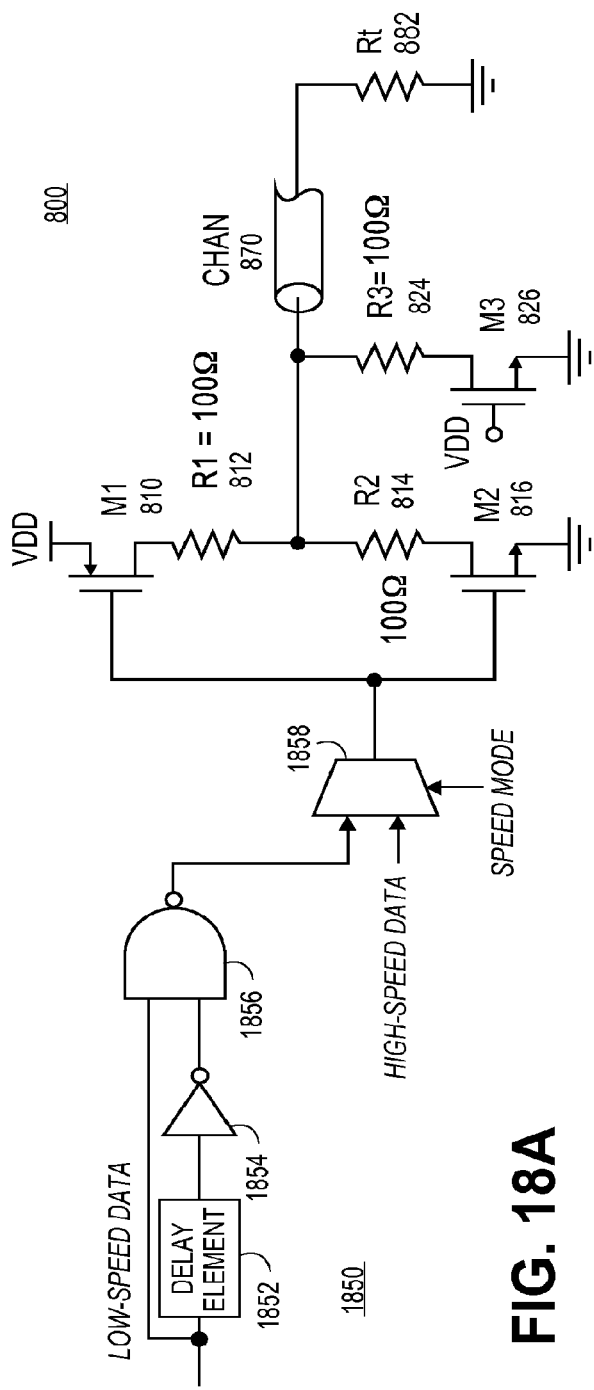
FIG. 18A is an illustration of an embodiment of a pulsing mechanism for a driver.

FIG. 18A is an illustration of an embodiment of a pulsing mechanism for a driver. In some embodiments, in order to mitigate power consumption issues at low speeds, a pulsing scheme is provided for low-speed operation. In some embodiments, a driver 800 is coupled with a pulsing mechanism 1850. In this illustration, the driver 800 is a Type-I driver as described above with regard to FIG. 8. In some embodiments, the pulsing mechanism 1850 receives low speed data (such as data being transmitted at a frequency that is below a certain threshold), where the low speed data is input to a delay element 1852 and to a first input of a NAND gate 1856. A delayed data signal produced by the delay element 1852 is received by an inverter 1854, which provides a second input to the NAND gate element 1858. In some embodiments, the pulsing mechanism 1850 includes multiplexer 1858 receiving a speed mode signal and receiving either a high-speed data input without alteration or a low speed data input that has been subject to pulsing by the pulsing mechanism 1850.

In some embodiments, the pulsing mechanism 1850 operates such that a high-transition is detected, and with a certain delay (based on the characteristics of the delay element 1852 other elements of the mechanism) the output is pulled low, providing a sufficient pulse for a receiver to detect the high bit. By having a much smaller width pulse than the full input bit signal (a shorter duty cycle than the input bit signal), power dissipation may be significantly reduced at low-speeds with termination. In high-speed operation, the multiplexer 1858 provides a bypass path to provide full and equal pulses in both high and low states for high-speed data. In some embodiments, the transition point between low-speed and high-speed data rates for the purpose of using the pulsing mechanism may be determined based on the current drain during high-state operation and the sensitivity of the receivers.

Figure 18B:
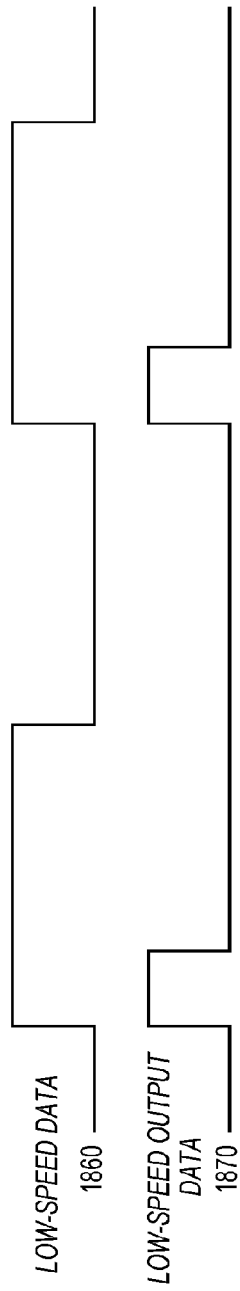
FIG. 18B is an illustration of signals generated by an embodiment of a pulsing mechanism of a driver.

FIG. 18B is an illustration of signals generated by an embodiment of a pulsing mechanism of a driver. Low speed data 1860, providing a full width bit signal, may result in excessive power dissipation by a driver. A pulsing mechanism, such as pulsing mechanism 1850 illustrated in FIG. 18A, operates to return a signal pulse to low prior to the full width of a bit signal, such that the illustrated low-speed output data 1870, which may be utilized to reduce power consumption in a driver circuit.

Table 1 compares certain performance characteristics for driver circuit technologies, including Type-I, Type-II, and Type-III driver technologies described above and illustrated in FIGS. 8-12. The following assumptions are made for the purpose of the analysis: $V_{DD}$=1.2 V; source and termination impedances are 50 ohms single-ended; dynamic power is not considered; and the swing requirements for differential structures are considered to be the same as single-ended structures because these are required to work at double the data rate.

As provided in Table 1, embodiments of Type-I, Type-II, and Type-III drivers may provide equal or better performance metrics among the parameters, which are commonly considered for a high-end driver. In addition, the power dissipation in pre-drivers provides additional power savings of embodiments of drivers in comparison with the conventional drivers.

TABLE 1

Performance comparison between different drivers

| Driver Structure | Power Dissipation | Data rate requirements | Voltage swing programmability | Termination Control |
|---|---|---|---|---|
| Differential voltage-mode | 1x | 2x | No | Yes |
| Single-ended voltage-mode | 2x | 1x | No | Yes |
| Differential current-mode | 1x | 2x | Yes | No |
| Single-ended current-mode | 2x | 1x | Yes | Yes |
| Type-I voltage-mode driver | 1.5x | 1x | Yes | Yes |
| Type-II mixed-mode driver | 1x | 1x | Yes | Yes |
| Type-III mixed-mode driver | 1x | 1x | Yes | Yes |

Figure 19:
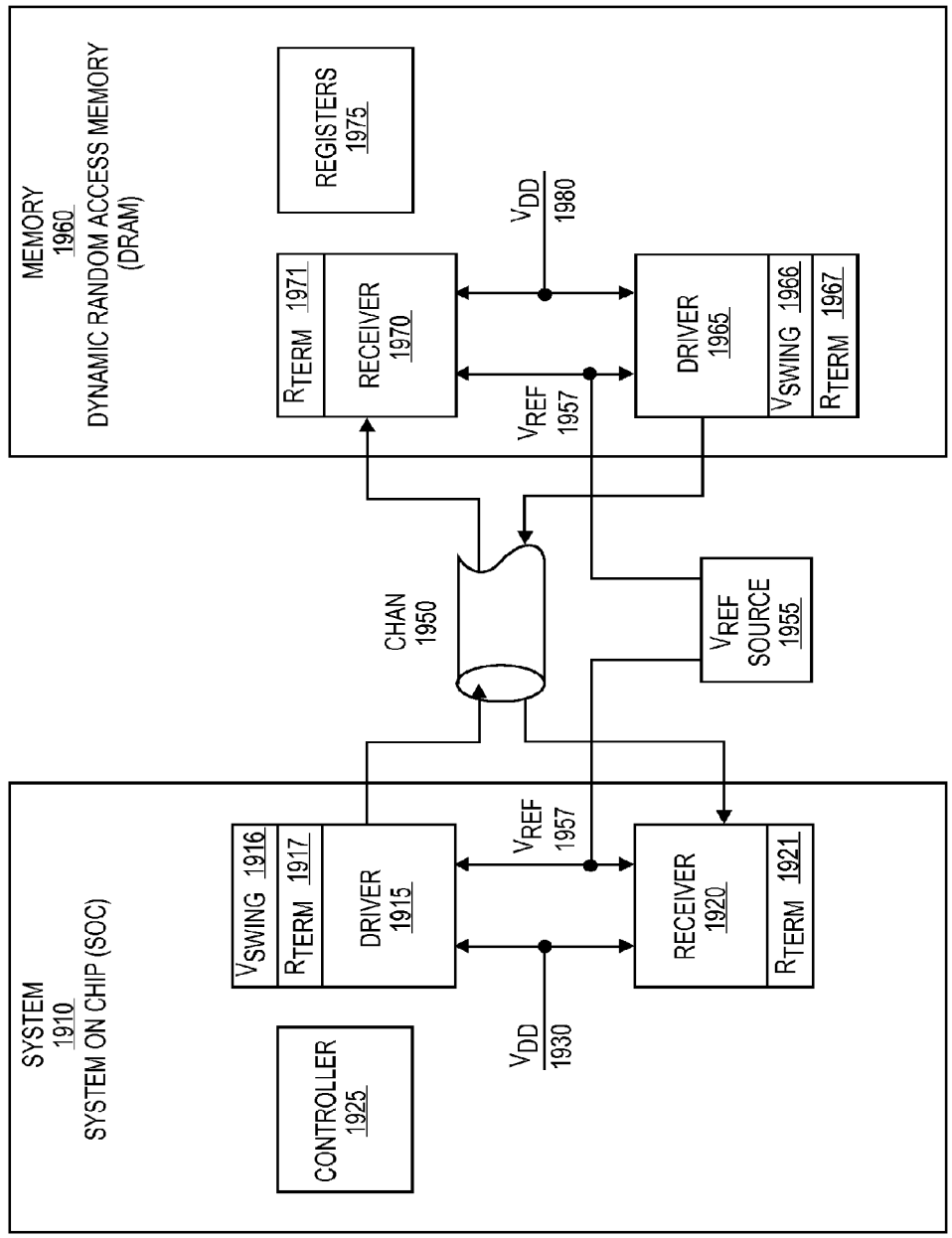
FIG. 19 illustrates an embodiment of a driver apparatus for an interface between devices.

FIG. 19 illustrates an embodiment of a driver apparatus for an interface between devices. In some embodiments, a first device, such as a system 1910, is coupled with a second device, such as a memory 1960, via a channel 1950 (which may represent one or more channels between the first device and the second device). In some embodiments, the system is a system on chip (SOC) and the memory is a dynamic random access memory (DRAM). In some embodiments, one or both of the system 1910 and memory 1960 includes a configurable multi-mode driver. In this illustration, the system 1910 includes a configurable multi-mode driver apparatus 1915, which is coupled via the channel 1950 with a receiver apparatus 1970, and the memory 1960 includes a configurable multi-mode driver 1965, which is coupled via the channel 1950 with a receiver apparatus 1920. In some embodiments, the driver apparatus 1915, the driver apparatus 1965, or both are a driver apparatus as illustrated in FIGS. 8 through 12.

In this illustration, driver apparatus 1915 of system 1910 may include a particular termination resistance ($R_{TERM}$) 1917 and may provide a particular voltage swing ($V_{SWING}$) 1916, and receiver apparatus 1920 may include a particular termination resistance 1921. Further, driver apparatus 1965 of memory 1960 may include a particular termination resistance 1967 and voltage swing 1966, and receiver apparatus 1970 may include a particular termination resistance 1971. While each driver and receiver apparatus is illustrated as having a termination resistance, one or more of such terminations may be a small or zero resistance. In some embodiments, the parameters of the drivers and receivers for devices 1910 and 1960, such as the voltage swings and termination resistances, may be either symmetrical or asymmetrical between the devices depending on the implementation. For example, the termination resistance 1917 provided for the driver apparatus 1915 of system 1910 may not match a termination resistance 1967 for the driver apparatus 1965 of memory 1960, and a termination resistance 1921 provided for the receiver apparatus 1920 of system 1910 may not match a termination resistance 1971 for the receiver apparatus 1970 of memory 1960. In an additional example, a sensitivity of the receiver apparatus 1920 may be different from a receiver sensitivity of the receiver apparatus 1970. In one example, in a read operation from the memory 1960 to the system 1910, with data being driven by driver apparatus 1965 to receiver apparatus 1920, the receiver apparatus 1920 of the system 1910 may include a valid termination. However, in a write operation from the system 1910 to the memory 1960, with data being driven by driver apparatus 1915 to receiver apparatus 1970, there may be no termination for the receiver apparatus 1970 on the memory 1960 side, where no termination may indicate a very small (near zero) or very large (infinite) resistance.

In some embodiments, parameter information for the link between the system 1910 and memory 1960, such as data regarding voltage swings, termination, reflection capability, may be stored in on chip registers 1975 of the memory 1960, if the memory 1960 is the secondary device. For example, the system may include has a controller 1925 while the memory does not include a controller. In some embodiments, the parameter information regarding voltage swings and termination resistance is stored in the on chip registers for the memory 1960 to access.

As illustrated in FIG. 19, the driver apparatus 1915 and receiver apparatus 1920 of the system 1910 may receive a supply voltage ($V_{DD}$) 1930, and driver apparatus 1965 and receiver apparatus 1970 of the memory 1960 may receive a supply voltage 1980. In a conventional scheme, the voltage swing of a driver apparatus is a function of the relevant supply voltage, and a reference voltage ($V_{REF}$) is derived from the relevant supply voltage. In some embodiments, the voltage swing of driver apparatus 1915 or 1965 is referenced to a common system reference voltage ($V_{REF}$) 1957, rather than to the supply voltage. In some embodiments, the reference voltage 1957 may be generated by an external source, such as reference voltage source 1955, that provides the same reference voltage to each driver apparatus. In some embodiments, the receiver apparatuses 1920 and 1970 may also receive the reference voltage 1957.

In some embodiments, the voltage swing 1916 of driver apparatus 1915 and voltage swing 1966 for driver apparatus 1965 are functions of $V_{REF}$. For example, the voltage swing 1916 on driver apparatus 1915 may be 2 times $V_{REF}$ while the voltage swing 1966 on driver 1965 may be 1.5 times $V_{REF}$. In some embodiments, voltage swings are a function of $V_{REF}$, independent of supply $V_{DD}$. In some embodiments, the voltage swing is thus independently configurable with a constant voltage supply. Further, in some embodiments, the configuration of the voltage swing has no more than minimal effect on operation at an output node. In some embodiments, the receiver apparatuses 1920 and 1970 may also utilize the reference voltage 1957. In an example, a reception sensitivity of receiver apparatus 1920 or 1970 may be a function of the reference voltage.

Figure 20:
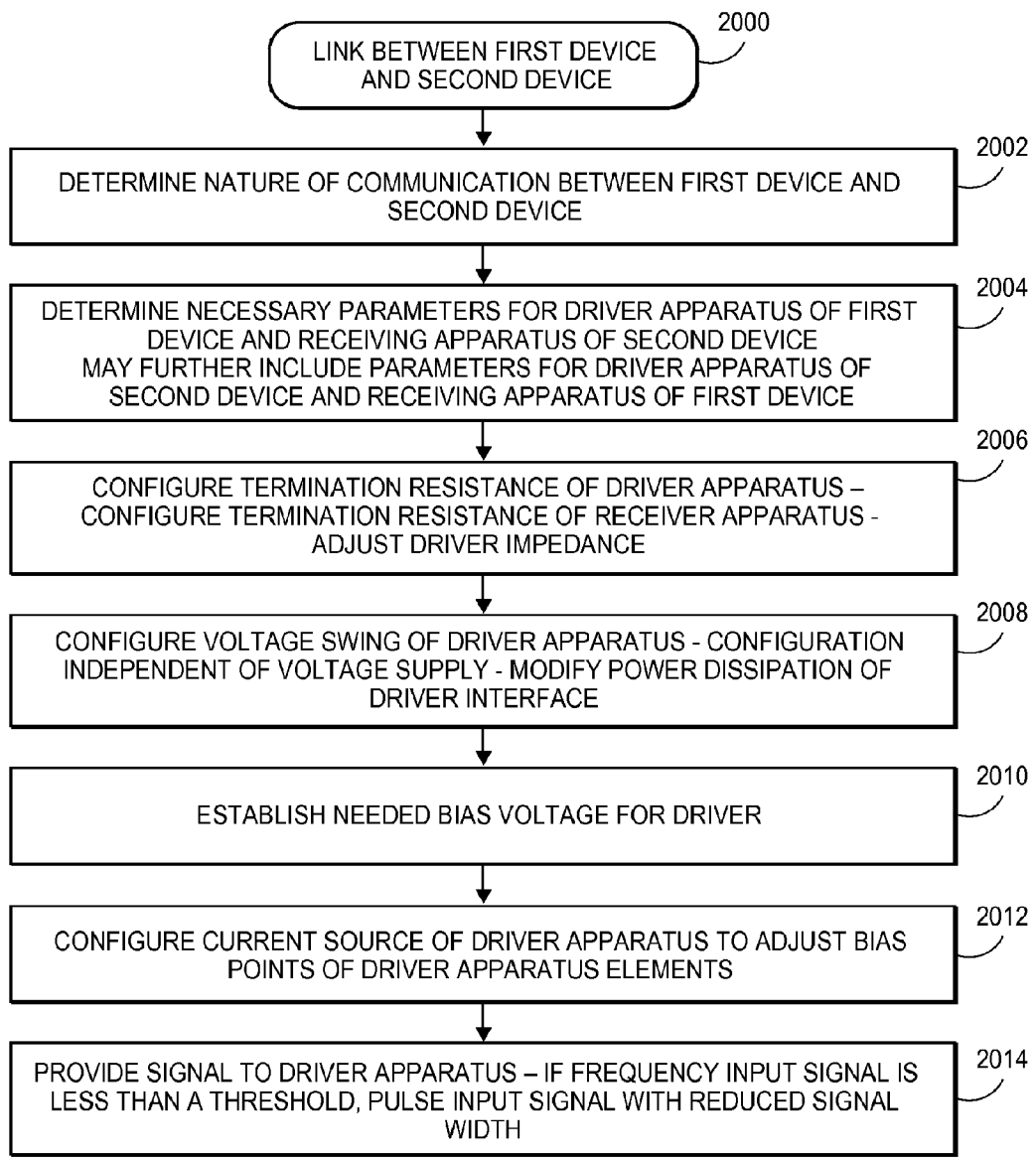
FIG. 20 is a flowchart to illustrate an embodiment of a process for driving data signals from a first device to a second device.

FIG. 20 is a flowchart to illustrate an embodiment of a process for driving data from a first device to a second device. In some embodiments, in a link between a first device and a second device 2000, the first device includes a configurable driver apparatus and the second device includes a receiver apparatus. In some embodiments, the receiver apparatus may also configurable, including a configurable termination resistance. In some embodiments, a determination may be made regarding the nature of the communications between the first device and the second device to identify correct parameters for the interface 2002. In some embodiments, the necessary parameters for the driver apparatus of the first device and the receiving apparatus of the second device are determined 2204. In some embodiments, parameters for a reverse connection of a driver apparatus of the second device and a receiving apparatus of the first device are also determined. In some embodiments, parameters for an interface may be stored in one or more registers of a device, such as in a device, including a memory device, that does not include a controller.

In some embodiments, a termination resistance of the driver apparatus, the receiver apparatus, or both is configured. In some embodiments, the configuration of the termination resistance may provide in part for configuration of a driver impedance 2006.

In some embodiments, a voltage swing of the driver apparatus of the first device is configured 2208. In some embodiments, the configuration of the voltage swing is independent of a source voltage for the first device, and may operate to adjust the power dissipation of the driver apparatus.

In some embodiments, a bias voltage is provided for the driver apparatus 2010. In some embodiments, the establishment of the bias voltage may include, for example, an apparatus as illustrated in FIG. 13. In some embodiments, a bias point may be adjusted through adjustment of a configurable current source of the driver apparatus 2012.

In some embodiments, the application of a signal to the driver apparatus further includes determining a frequency of an input signal to the driver apparatus, and, if the frequency is below a threshold, changing the input signal to a pulse with a width that is shorter than a width of the input signal 2014. The pulsing of the input signal may include, for example the pulsing mechanism 1850 illustrated in FIG. 18A.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described. The illustrated elements or components may also be arranged in different arrangements or orders, including the reordering of any fields or the modification of field sizes.

The present invention may include various processes. The processes of the present invention may be performed by hardware components or may be embodied in computer-readable instructions, which may be used to cause a general purpose or special purpose processor or logic circuits programmed with the instructions to perform the processes. Alternatively, the processes may be performed by a combination of hardware and software.

Portions of the present invention may be provided as a computer program product, which may include a computer-readable storage medium having stored thereon computer program instructions, which may be used to program a computer (or other electronic devices) to perform a process according to the present invention. The computer-readable storage medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/computer-readable medium suitable for storing electronic instructions. Moreover, the present invention may also be downloaded as a computer program product, wherein the program may be transferred from a remote computer to a requesting computer.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations may be made. The particular embodiments are not provided to limit the invention but to illustrate it.

If it is said that an element "A" is coupled to or with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects.

The invention claimed is:

1. A single-ended driver apparatus for driving signals comprising:
   an input node to receive an input signal;
   an output node to transmit a driven signal generated from the input signal on a communication channel;
   a plurality of strings switchably coupled between the output node and the input node, each of the plurality of strings comprising at least one transistor coupled to at least one variable resistor;
   a circuit for configuring a termination resistance at the driver output to be a specified resistance value and for configuring a voltage swing of the driven signal at the driver output to be at a specified voltage swing value by controlling at least one of: (1) a number of strings of the plurality of strings that are coupled between the input node and the output node or (2) a value of at least one of the variable resistors of the plurality of strings.

2. The apparatus of claim 1, wherein configuring the voltage swing of the driven signal generates a minimal effect on a speed of operation of an output node of the driver apparatus.

3. The apparatus of claim 1, wherein configuring the termination resistance and the voltage swing is performed concurrently.

4. The apparatus of claim 1, further comprising a mechanism to adjust linearity of output voltage in relation to current by adjusting an impedance of the driver apparatus.

5. The apparatus of claim 1, wherein the apparatus is a first type of driver apparatus and wherein in each of the plurality of strings, a first end of the resistor is coupled with the communication channel and a second end of the resistor coupled with at least one of a first terminal of a transistor or ground, a second terminal of the transistor being coupled with at least one of ground or a current source or a voltage source, wherein the first type of driver apparatus comprises a current-mode driver.

6. The apparatus of claim 1, wherein the apparatus is second type of driver apparatus and wherein in each of the plurality of strings, a first end of the resistor being coupled with the communication channel and a second end of the resistor coupled with a first terminal of a transistor being coupled with ground, the second type of drive apparatus being a voltage mode driver.

7. The apparatus of claim 6, wherein the apparatus includes a second transistor that is coupled to the source of the first transistor included in the strings of resistors and transistors, wherein the second transistor acts as a source follower of the first transistor, and the second transistor receives a bias voltage.

8. The apparatus of claim 1, wherein the apparatus is a third type of driver apparatus and wherein in each of the plurality of strings, a first end of a first resistor is coupled with the communication channel and a second end of the first resistor is coupled with a first terminal of a first transistor, the second end of the first transistor being coupled with ground, a first end of a second resistor coupled with the communication channel and a second end of the second resistor coupled to a bleeder current source and a second transistor connected to a voltage source, the third type of driver being a mixed voltage-mode current-mode driver.

9. The apparatus of claim 8, wherein the second transistor is coupled to an inverter that has a regulated supply voltage to control the output voltage swing of the driver.

10. The apparatus of claim 1, further comprising a pulsing mechanism that transforms the input signal to a pulsed input signal when the input signal is operating at a low speed, the pulsing mechanism includes a delay element to delay a low speed signal and a NAND logic element to receive the low speed signal and the delayed low speed signal.

11. The apparatus of claim 10, further comprising a multiplexer receiving the input signal and the pulsed input signal as inputs, the multiplexer to receive a control signal to choose the input signal if the signal frequency is above a certain frequency and to choose the pulsed input signal if the signal frequency is below the certain frequency.

12. A method for configuring a communication interface, the method comprising:
    determining parameters for an interface between a first device and a second device, the first device including a configurable driver apparatus;
    configuring a termination resistance of the driver apparatus of the first device at a driver output node to be a specified resistance value and a voltage swing of the driver apparatus of the first device to be a specified voltage swing value by controlling at least one of: (1) a number of strings of the plurality of strings that are coupled between the input node and the output node (2) a value of at least one of the variable resistors of the plurality of strings of the configurable driver apparatus.

13. The method of claim 12 further comprising of determining a frequency of an input signal for the driver apparatus, comparing it to a threshold value, and converting the input signal into a signal pulse with a shorter duration than the input signal on determination that the frequency of the input signal is less than the threshold value.

14. The method of claim 12, wherein the configuration of the termination resistance and the voltage swing can be performed concurrently.

15. The method of claim 12, wherein the configuration of the voltage swing of the driver apparatus generates a minimal effect on a speed of operation of an output node of the driver apparatus.

16. A system comprising:
    a single-ended driver apparatus that includes:
    an input node to receive an input signal;
    an output node to transmit a driven signal generated from the input signal on a communication channel;
    a plurality of strings switchably coupled between the output node and the input node of the single-ended driver apparatus, each of the plurality of strings comprising at least one transistor coupled to at least one variable resistor; and
    a circuit for configuring a termination resistance at the driver output to be a specified resistance value and for configuring a voltage swing of the driven signal at the driver output to be at a specified voltage swing value by controlling at least one of: (1) a number of strings of the plurality of strings that are coupled between the input node and the output node or (2) a value of at least one of the variable resistors of the plurality of strings;
    a communication channel, wherein the single-ended driver apparatus is coupled with the communication channel; and
    a receiving apparatus coupled with the communication channel to receive the driven signal.

17. The system of claim 16, wherein the receiving apparatus receives a reference voltage and includes a reception sensitivity, the reception sensitivity being based on the reference voltage.

18. The system of claim 16, further comprising a feedback circuit to generate a bias voltage for the driver apparatus.

19. The system of claim 18, wherein the feedback circuit includes an error generator to generate an error between a required voltage swing and an actual voltage swing of the driver apparatus.

* * * * *